United States Patent [19]

Miyahara et al.

[11] Patent Number: 4,764,898

[45] Date of Patent: Aug. 16, 1988

[54] VORTEX MEMORY DEVICE

[75] Inventors: Kazunori Miyahara; Masashi Mukaida; Koji Hokawa, all of Kanagawa, Japan

[73] Assignee: Nippon Telegraph and Telephone Corporation, Tokyo, Japan

[21] Appl. No.: 808,424

[22] Filed: Dec. 12, 1985

[30] Foreign Application Priority Data

| Dec. 13, 1984 | [JP] | Japan | 59-261789 |
| Jan. 30, 1985 | [JP] | Japan | 60-16159 |
| Jan. 30, 1985 | [JP] | Japan | 60-16160 |
| Nov. 15, 1985 | [JP] | Japan | 60-255136 |
| Nov. 18, 1985 | [JP] | Japan | 60-258316 |
| Nov. 18, 1985 | [JP] | Japan | 60-259312 |
| Nov. 18, 1985 | [JP] | Japan | 60-259313 |
| Nov. 19, 1985 | [JP] | Japan | 60-257678 |
| Nov. 25, 1985 | [JP] | Japan | 60-262513 |
| Nov. 25, 1985 | [JP] | Japan | 60-262514 |
| Nov. 25, 1985 | [JP] | Japan | 60-262515 |

[51] Int. Cl.$^4$ .......................................... G11C 11/44
[52] U.S. Cl. ...................................... 365/162; 357/5; 307/306
[58] Field of Search ............... 365/160, 161, 162, 189; 357/5; 307/306, 277, 462

[56] References Cited

FOREIGN PATENT DOCUMENTS 0181495 8/1982 Japan.

OTHER PUBLICATIONS

Applied Physics Letters, vol. 39, No. 12, Dec. 1981, pp. 992–993, "Trapped Vortex Memory Cells" by Shingo Uehara et al.

Primary Examiner—Stuart N. Hecker
Assistant Examiner—Glenn A. Gossage
Attorney, Agent, or Firm—Blakely, Sokoloff, Taylor & Zafman

[57] ABSTRACT

The superconducting memory device comprises a thin type-II superconductor film for storing an Abrikosov vortex, a write control line for generating the vortex in the superconductor film, and a vortex detector for detecting a polarity of the vortex stored in the film. The vortex detector includes a Josephson junction and a read control current line. The Josephson junction comprises a base electrode, a counter electrode and a tunnel barrier region sandwiched between the base electrode and the counter electrode. By utilizing a fact that a shift direction of the threshold characteristics of the vortex detector corresponds to the polarity of the vortex stored in the superconductor film, a flux crossing the tunnel barrier region of the Josephson junction due to the stored vortex is detected by the read control line.

29 Claims, 21 Drawing Sheets

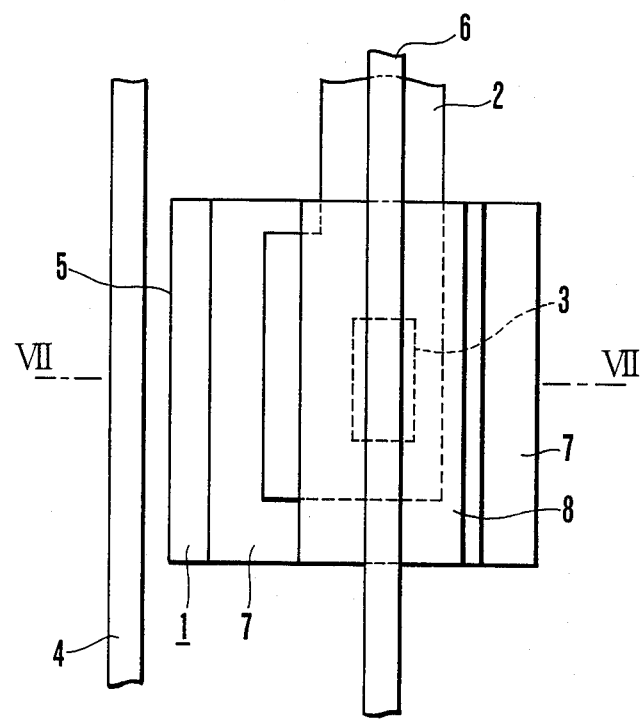
F I G.6
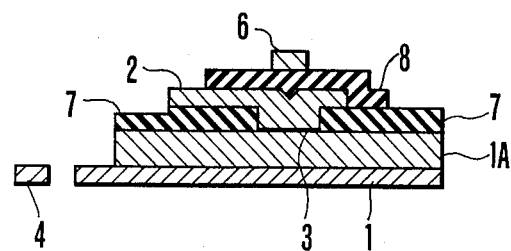
F I G.7

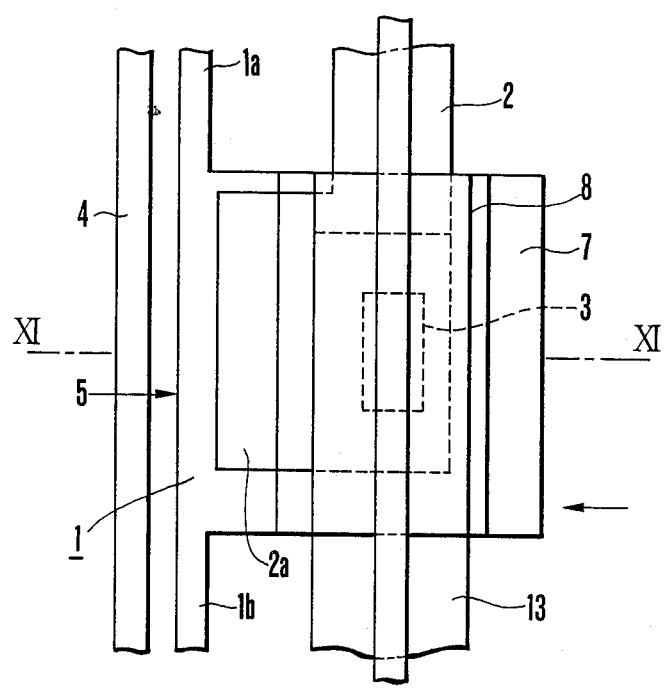
F I G.10
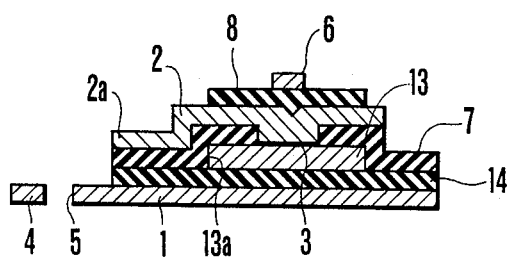
F I G.11

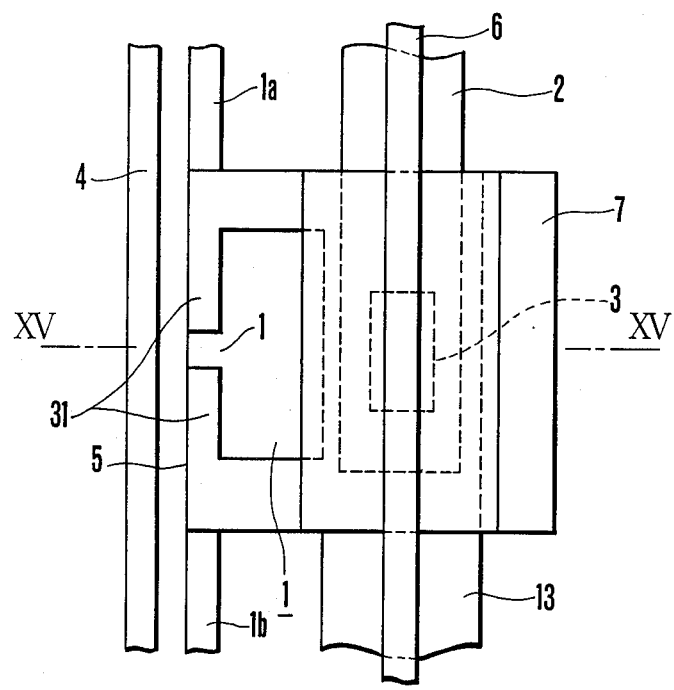
F I G. 14
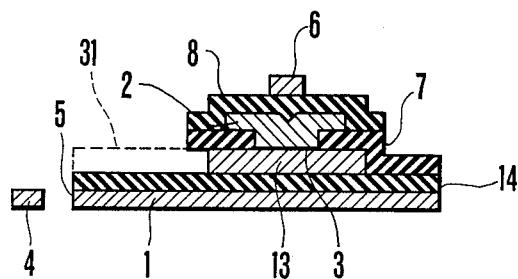
F I G. 15

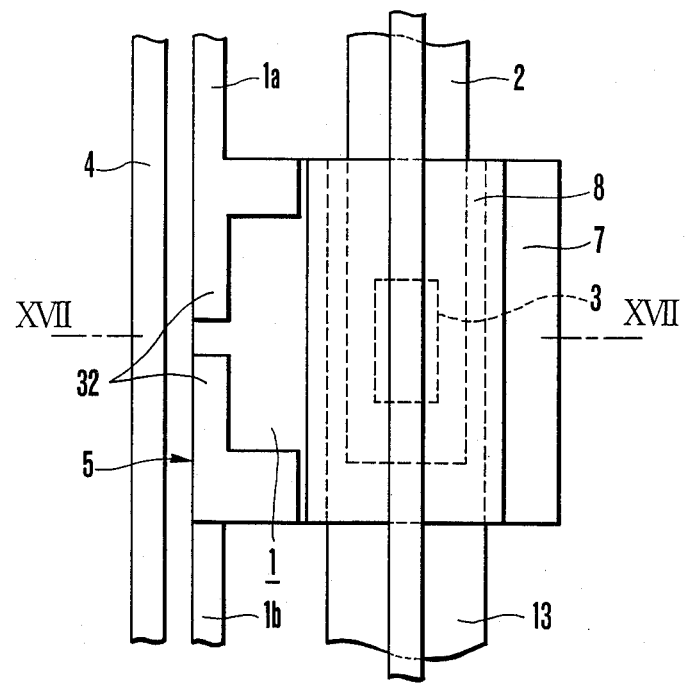
F I G. 16
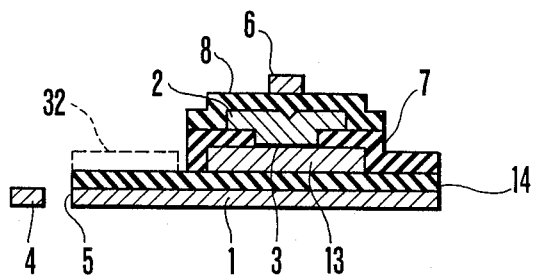
F I G. 17

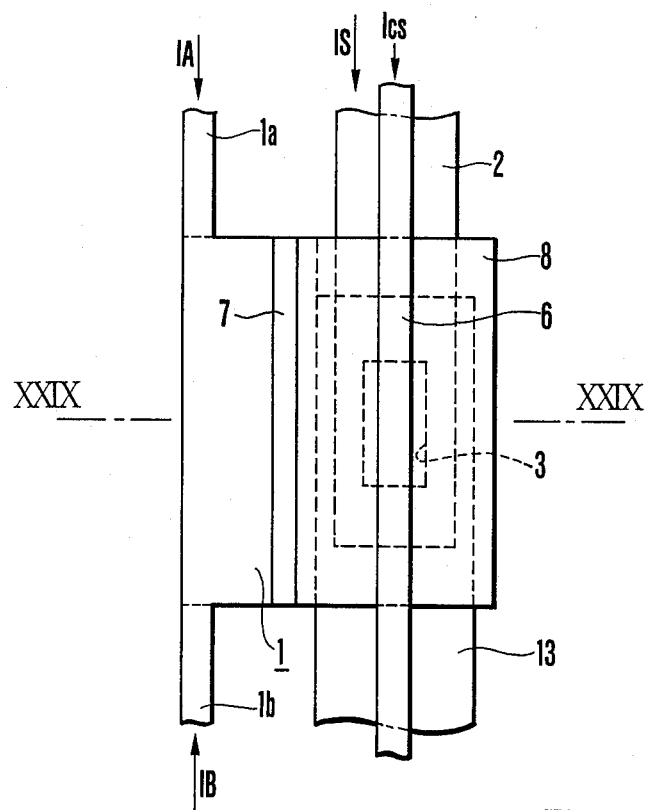
F I G. 28
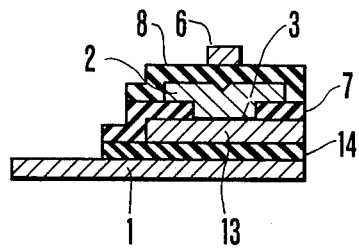
F I G. 29

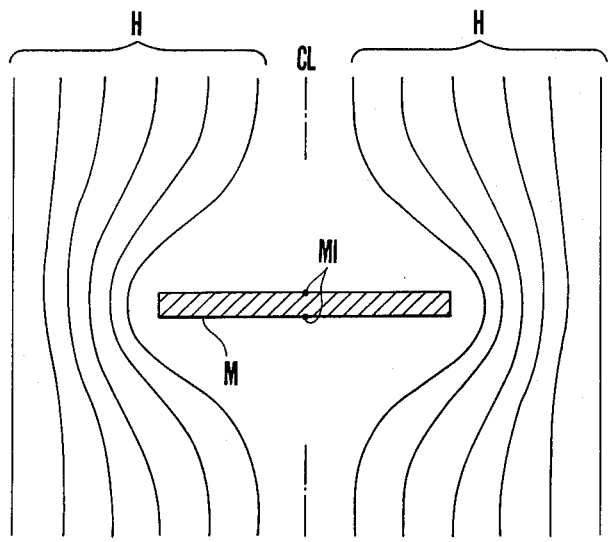
FIG. 34
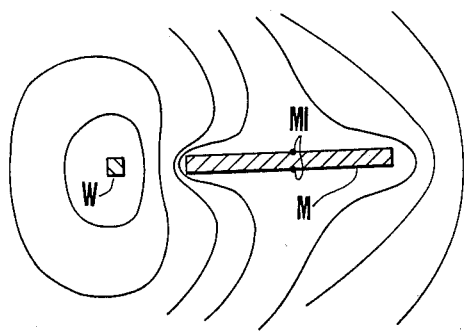 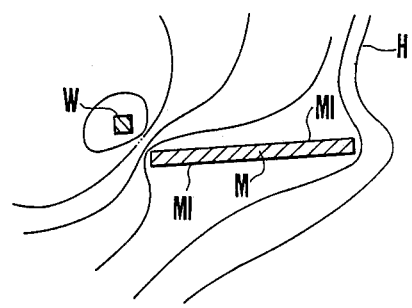
FIG. 35A  FIG. 35B

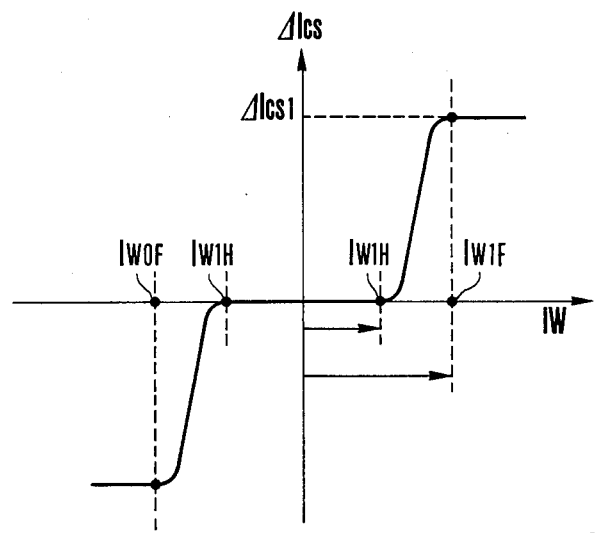
F I G. 41 A
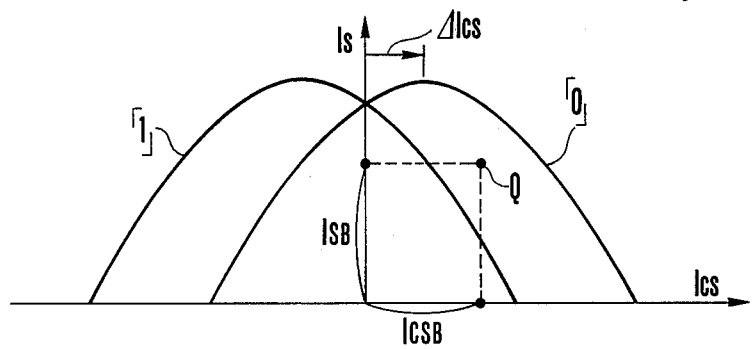
F I G. 41 B
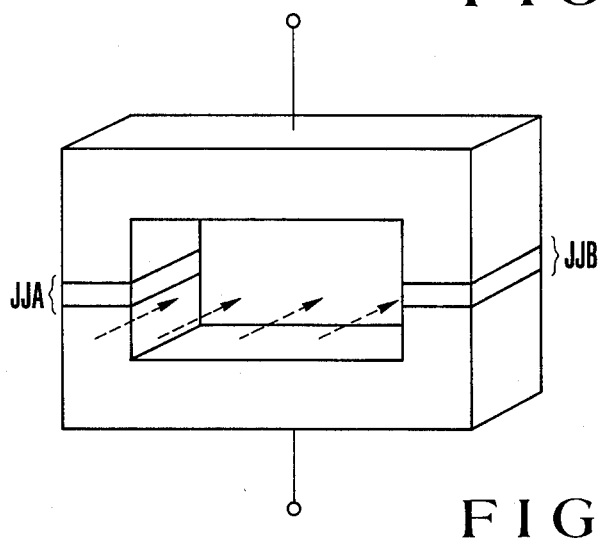
F I G. 42

VORTEX MEMORY DEVICE

BACKGROUND OF THE INVENTION

The present invention relates to a superconducting memory device and, more particularly, to a superconducting memory device utilizing Abrikosov vortex as information.

A conventional superconducting memory device utilizes as a detecting section a Josephson junction, which realizes the Josephson effect upon the loose coupling of two superconductors through a thin insulating film (i.e., a tunnel barrier layer). In the Josephson junction, a Josephson current flowed between the superconductors can be modulated by an external magnetic flux, and the junction voltage is varied across the Josephson junction. By utilizing this phenomenon, stored information can be read out or detected as a "0" (zero-voltage state) or a "1" (non-voltage voltage state).

A typical example of a conventional superconducting memory device is a persistant current-type memory using the above-mentioned Josephson junction as a gate, described by W.H. Henkels et al. in IBM Journal Research Develop., Vol. 24, No. 2.

However, this memory has the following drawbacks:

(1) Since Josephson gates are combined to constitute a memory cell, the memory cell arrangement is complicated, and the number of Josephson junctions per memory cell is large. A memory of this type is not suitable for high-density integration.

(2) Since the Josephson vortex is stored as storage data in an inductance loop and the area of inductance is large, a compact cell cannot be obtained.

(3) Since the matrix size of the memory element and the lead on the matrix driver increase, memory access time is not nearly as fast as could be expected from the switching time of the element.

In order to solve the above problems, a superconducting memory device has been developed wherein an Abrikosov vortex generated in a type-II superconductor is used as an information bit. The superconducting memory device comprises: a first superconductor film of a type-II superconductor constituting a square or rectangular lower electrode; a second superconductor film formed to surround three edges of the first superconductor film and having a thickness larger than that of the first film; a third superconductor film which is formed through a tunnel barrier layer on the portion of the first superconductor film surrounded by the second superconductor film and which serves as a counter electrode constituting a Josephson junction together with the base electrode and the tunnel barrier layer; and a superconductor write control line formed in parallel with the open edge of the first superconductor film but positioned slightly apart therefrom. The second superconductor film serves to limit the vortex diffusion which causes decrease of the vortices in the first superconductor film.

However, such conventional superconducting memory device stores "1" and "0" data bits as the presence or absence, respectively, of the Abrikosov vortex. Explaining it in more detail, in write mode, a write current is supplied through the write control line to generate a magnetic flux, thereby internally generating the Abrikosov vortex from the open edge of the first superconductor film near the write control line. When a "1" is to be written, a current is supplied through the write control line in a forward direction. However, when a "0" is to be written, a current is supplied through the write control line in the reverse direction, so that the vortex generated in the first superconductor film when "1" was written is cancelled, thus setting the number of vortices to zero. According to another technique for writing a "0", by flowing current in the superconductor film the vortex held in the superconductor film is removed from the film. In another example, a heating resistor is arranged under the first superconductor film for writing "0" so that the first superconductor film is transferred to its normal state, thereby removing the vortex from the film. The detection of storage information is accomplished by utilizing the fact that, when Abrikosov vortex is present in the base electrode of the Josephson junction, the effective Josephson area is decreased and the critical Josephson current is also decreased. Under such state, when a bias current is flowed through the Josephson junction, it is switched to a nonzero voltage state. On the other hand, where the vortex is not present in the base electrode, even if the bias current is flowed through the Josephson junction, it is not switched to load a superconductive state. These two state are used for detection of "1" and "0" data.

Such superconducting memory devices are described in detail in Applied Physics Letters, Vol. 39, No. 12, December 1981, PP. 992–993, "Trapped Vortex Memory Cells" by Shingo Uehara et al. and in Japanese Preliminary Patent Publication No. 57-181495, issued on Aug. 7, 1982.

In a superconducting memory device of the Abrikosov vortex type having the arrangement described above, where an attempt is made to write a "0", after the present storage state must be read out and checked, "0" is written. When a "0" has already been written in the memory device, i.e., when no vortex is held in the superconductor film, if an attempt is made to write "0", a vortex with an opposite polarity is stored therein. This is not a proper storage state and is detected as an error. In order to avoid this, then, storage data must be read out before write operation is performed. Different write procedures are required in accordance with the storage states of the memory device. However, the write access time and hence the cycle time of the computer are prolonged, which is a critical drawback. When the vortex held in the memory cell is removed and a "0" is written therein, an additional heat wire is required. Further, since the method utilizes thermal transition, the removal of stored data is performed at low speeds and prolongs the write access time. According to another conventional technique for removing the vortex by utilizing a Lorentz current, only one signal line is used to write a "0", and since a current must flow in the superconductor in the write and read modes, the signal line cannot be divided into word and bit lines. Therefore, a specific cell in the memory cell matrix cannot be selected, and a "0" cannot be written in the desired memory cell.

According to the above conventional arrangement, the vortex must be injected into the lower electrode in the Josephson junction so that a large number of vortices are required, thus increasing the operating current in the write mode. It is also difficult to prepare peripheral circuits for driving an arrangement requiring a large operating current.

As described above, the "0" state is achieved by cancelling the previous vortex. When the write cycle of "1" and "0" is repeated, it is impossible to set the number of vortices to be identically zero in the "0" write mode. The residual vortices are accumulated so that erroneous operation of the memory device is induced.

In association with the above-described problem, the "0" state can be accurately maintained by providing vortices having the same number as but a polarity opposite to that of the stored vortex. However, this write operation margin is narrow, and stable operation cannot be expected.

SUMMARY OF THE INVENTION

It is, therefore, a principal object of the present invention to provide a superconducting memory device which is suitable for high-density integration and can be operated at high speeds.

It is another object of the present invention to provide a superconducting memory which does not require complex peripheral circuits and has a simple and compact structure.

It is still another object of the present invention to provide a superconducting memory device which has a wide operating margin and provides stable operation.

It is still another object of the present invention to provide a superconducting memory device which is free from operation failure even when the write and read cycles are repeated.

In order to achieve the above objects of the present invention, there is provided a superconducting memory device comprising: vortex storage means constituted by a thin type-II superconductor film and for storing an Abrikosov vortex; write control means for generating the vortex in the vortex storage means; and vortex detecting means for detecting a polarity of the vortex stored in the vortex storage means, the vortex detecting means including a Josephson junction and a read control current line, the Josephson junction comprising a base electrode, a counter electrode and a tunnel barrier region sandwiched between the base electrode and the counter electrode, wherein by utilizing a fact that a shift direction of the threshold characteristics of the vortex detecting means corresponds to the polarity of the vortex stored in the vortex storage means, a flux crossing the tunnel barrier region of the Josephson junction due to the stored vortex is detected by the read control line.

BRIEF DESCRIPTION OF THE DRAWINGS

FIG. 6 view of a memory cell in a superconducting memory device according to still another embodiment of the present invention;

FIG. 7 is a sectional view of the cell taken along the line VII—VII of FIG. 6;

FIG. 10 is a plan view of a memory cell in a superconducting memory device according to still another embodiment of the present invention;

FIG. 11 is a sectional view of the memory device taken along the line XI—XI of FIG. 10;

FIG. 14 is a plan view of a memory cell in a superconducting memory device according to still another embodiment of the present invention;

FIG. 15 a sectional view of the memory device taken along the line XV—XV of FIG. 14;

FIG. 16 is a plan view of a memory cell in a superconducting memory device according to still another embodiment of the present invention;

FIG. 17 is a sectional view of the memory device taken along the line XVII—XVII of FIG. 16;

FIG. 28 is a plan view of a memory cell in a superconducting memory device according to still another embodiment of the present invention;

FIG. 29 is a sectional view of the memory device taken along the line XXIX—XXIX of FIG. 28;

FIGS. 34, 35A and 35B are respectively sectional views of a superconductor film M for explaining the write magnetic insensitive region;

FIGS. 41A and 41B are graphs for explaining the operation of the 4-bit memory cell matrix of FIG. 40; and FIG. 42 is a perspective view showing a modification of a Josephson junction used in the present invention.

DESCRIPTION OF THE PREFERRED EMBODIMENTS

Figure 1:
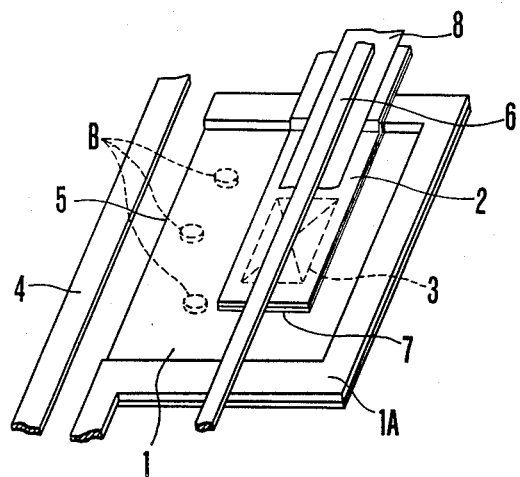
FIG. 1 is a perspective view of a memory cell in a superconducting memory device according to an embodiment of the present invention.
Figure 2:
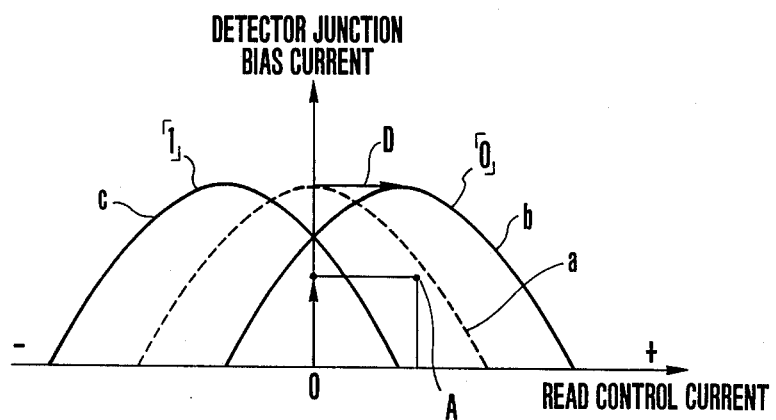
FIG. 2 is a graph showing threshold characteristics of a Josephson junction or detector junction shown in FIG. 1.

FIG. 1 shows an embodiment of a superconducting memory device according to the present invention. Referring to FIG. 2, the device has a first superconductor film 1 serving as a vortex storage section for holding an Abrikosov vortex. The film 1 is constituted by a thin type-II superconductor film. An insulating layer 7 is formed on the type-II superconductor film 1, and a hole is formed in the insulating layer 7, so that the portion of the film 1 which corresponds to hole serves as a base electrode. A thin tunnel barrier layer 3 is formed on the superconductor film in the hole. A superconductor 2 is formed on the tunnel barrier layer 3 so that a Josephson junction is formed together with the tunnel barrier layer and the base electrode 1. The superconductor 2 is also formed on the insulating layer 7. At least one memory state detector Josephson junction including the tunnel barrier layer 3 or a detector Josephson gate constituted by a plurality of Josephson junctions is arranged to detect a magnetic flux due to vortices B stored in the superconductor film 1. The superconductor film 1 is surrounded by an essentially U-shaped superconductor layer 1A. The thickness of the superconductor layer 1A is larger than that of the superconductor film 1. A superconductor write control line 4 is formed near an edge 5 of the superconductor film 1 which is not surrounded by the superconductor layer 1A and which is parallel therewith. At least one superconductor read control line 6 is formed on the detector junction through an insulating layer 8, so that the read control line 6 is magnetically coupled to the detector junction.

In this embodiment, in order to write a "1", a current is supplied to the write control line 4 and the vortex is generated in the superconductor film 1. On the other hand, in order to write a "0", a current with a polarity opposite to that for the "1" data write access is supplied to the write control line 4, and a vortex with a polarity opposite to that for the "1" data write access is generated in the superconductor film 1.

In the read operation, by utilizing the shift of the threshold characteristics of the detector junction 3 from a read control current axis in accordance with the polarity of the written vortex, the direction of the magnetic flux of the Abrikosov vortex can be discriminated, thereby detecting and reading out a "1" or "0".

FIG. 2 shows threshold characteristics of the detector junction. The threshold characteristic is defined as a curve plotted with maximum bias currents which may be supplied to the Josephson junction at a zero voltage against the read control current. Therefore, the read control current flowing through the read control line is plotted along the abscissa, and the bias current in the detector junction is plotted along the ordinate. In FIG. 2, broken line a represents a threshold characteristic curve when the vortex is not stored in the superconductor film, solid line b represents the threshold characteristic curve when the vortices for "0" are stored, and solid line c represents the threshold characteristic curve when the vortices for "1" are stored. Where an operating point is set, outside each characteristic curve, Josephson junction is switched to a non-zero voltage state, while inside each characteristic curve it is not switched to hold a superconductive state. Therefore, the characteristic of the detector junction which is represented by the curve a in FIG. 2 is shifted to the right or left in accordance with the polarity of the vortex. The direction of shift of this characteristic is determined in accordance with whether the polarity of the flux generated by the read control current of the detector section is the same as or opposite to that of the flux due to the vortex. When these fluxes have the same polarities, the magnetic flux coupled to the Josephson junction is increased, thus obtaining the characteristic curve c in FIG. 2. However, when the fluxes have opposite polarities, the magnetic flux coupled to the Josephson junction is decreased, and thus the characteristic curve b in FIG. 2 is obtained.

In a memory cell selected from the cell matrix upon a coincidence between the read control current and the detector junction bias current, the operating point is set to be point A. When a "0" is stored, since the operating point A is included in the region surrounded by the threshold characteristic curve b or plotted on the threshold characteristic curve b, voltage transition does not occur in the detector junction including the tunnel barrier layer 3. However, when a "1" is stored, the operating point A is not included in the region surrounded by the curve c, and voltage transition occurs in the detector junction including the tunnel barrier layer 3. According to this read operation, data "0" or "1" stored in any memory cell can be detected by whether or not the detector junction is switched to the voltage state. Reference symbol D denotes a shift value of the threshold characteristics along the read control axis.

Figure 3:
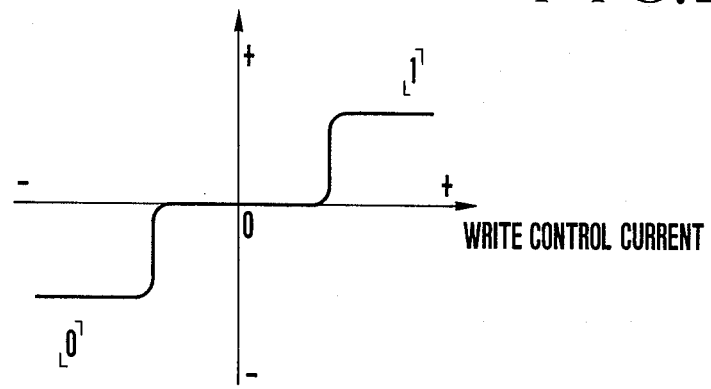
FIG. 3 is a graph for explaining the write operation of the superconducting memory device shown in FIG. 1.

The write characteristics of this embodiment are shown in FIG. 3. The write characteristics are obtained by plotting the shift value of the threshold characteristics of the detector junction 3 as a function of the write control current. It should be noted that the shift value is measured after the write operation is performed and the write control current is returned to zero.

When the write control current is increased, the shift value is kept zero up to a given write control current value. However, when the write control current exceeds the given value, the shift value is abruptly increased. Thereafter, the shift value is saturated and is kept constant. These characteristics are applicable irrespective of the polarity of the write control current. In other words, the write characteristics are point-symmetrical about the origin.

These write characteristics are obtained due to the following reason. In order to cause the superconductor film 1 as the vortex storage region to generate a vortex, a magnetic flux having a value exceeding a given value must be applied thereto. This magnetic flux value is called a lower critical field HCl, which is a material constant of superconductor.

A surface barrier at the edge of the superconductor film 1 prevents generation of the vortex. The film 1 has a pinning force for preventing vortex transportation. For these reasons, the vortices are generated when the write control current exceeds the given value.

A repulsive force acts between the vortices of the identical polarity. The number of vortices stored in the vortex storage region is limited. Even if the more vortices are generated, excessive vortices are emitted when the write control current is set to be zero. For this reason, the shift value is saturated at a large write control current.

With the characteristics as shown in FIG. 3, the following advantages are obtained.

When the write control current is set in a region in which the shift value is saturated in the write characteristics in FIG. 3, the shift value does not vary even if the write control current varies. Therefore, the write operation margin is greatly increased.

Furthermore, since the write characteristics are point-symmetrical about the origin, a "1" and a "0" can be written by changing only the polarities of the write control currents. The storage state of a cell need not be read out before write operation unlike the conventional cell. Therefore, the write operation can be performed at high speed and the peripheral circuits can be simplified.

The memory operation of the present invention can be also applied to a memory cell of a structure wherein the lower electrode of the detector junction including the tunnel barrier layer 3 is constituted by a superconductor layer electrically insulated from the superconductor film 1 with an insulating material.

In the embodiment of FIG. 1, when a material immediately under at least the tunnel barrier layer in the Josephson junction 3 comprises a material which does not substantially allow transportation of the vortex, the vortex can be more effectively utilized.

According to the embodiment described above, a "1" or "0" can be written irrespective of the previous storage state. The write operation can be simplified, the total access time can be shortened, and peripheral circuits can be simplified. Furthermore, the write characteristics have saturation characteristics, so that memory cells can have a large operation margin.

According to the present invention, two independent read signal currents are used, and a desired cell can be selected from the memory cell matrix upon a coincidence between these two currents, thus achieving functions indispensable for a random-access memory.

In the structure shown in FIG. 1, the vortex is also stored in the superconductor film 1 under the detector junction of the Josephson element. As a result, the effective junction area is decreased and therefore the Josephson current (maximum bias current flowed in the zero-voltage state) is decreased. This phenomenon causes a decrease in the operation margin. Furthermore, in the structure of FIG. 1, the Josephson junction is formed on the film 1, which stores the Abrikosov vortex. There are limits for decreasing the size of the storage region and the write current. In order to solve this problem, the structure shown in FIGS. 4 and 5 is proposed.

Figure 4:
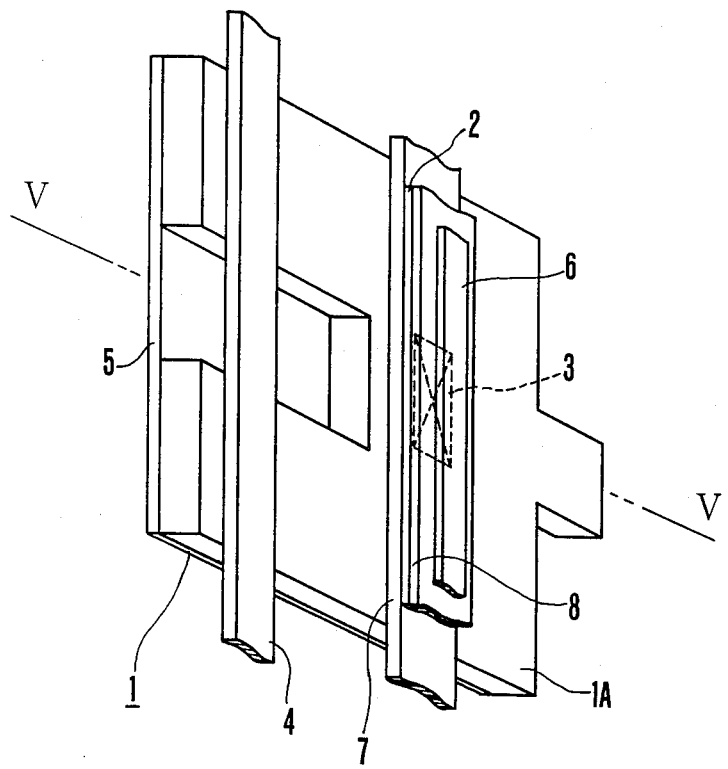
FIG. 4 is a perspective view of a memory cell according to another embodiment of the present invention.
Figure 5:
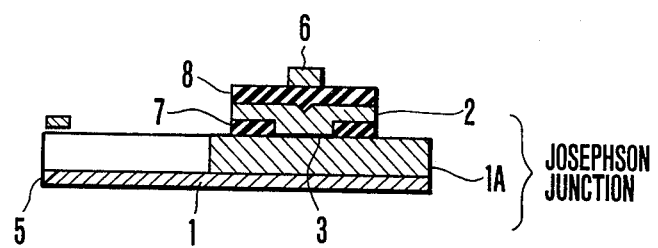
FIG. 5 is a sectional view of the memory cell taken along the line V—V of FIG. 4.

FIGS. 4 and 5 show another embodiment of a superconducting memory device according to the present invention. The memory device in FIGS. 4 and 5 is substantially the same as that in FIG. 1, except that a detector junction including the tunnel barrier layer 3 is formed not on a superconductor film 1 serving as a vortex storage region but on a superconductor layer 1A, thus isolating the storage region and preventing other vortices from being stored in the storage region. In this case, a Josephson junction shown in FIGS. 4 and 5 is formed on a U-shaped thick superconductor layer 1A formed above a superconductor film 1, which serves as the storage region. The Josephson junction is formed on the superconductor layer 1A and located away from an edge 5 of the superconductor film 1. The edge 5 does not correspond to the superconductor layer 1A and is located near a vortex write control line 4. The superconductor layer 1A serves as the lower electrode. A superconductor layer 2 is formed on a tunnel barrier layer 3, which is formed in a hole of an insulating layer 7, and serves as an upper electrode, thereby constituting the Josephson junction. A read control line 6 is formed on the superconductor layer 2 as the upper electrode through an insulating layer in the same manner as described above.

The same operation as the previous embodiment can be performed in the cell with the arrangement described above. The operation of this embodiment will be briefly described. In the write mode, a current is flowed in the write control line 4 to generate a magnetic flux, and the magnetic flux is stored from the edge 5 of the superconductor film 1 as the data storage region. The written vortex is retained in the superconductor film 1 as the storage region even if the write current on the write control line 4 is zero. The "0" write operation is performed by flowing to the write control lines a current with a polarity opposite to that of the "1" write current, so that the vortices with a polarity opposite to that of the vortices stored in the superconductor film 1 are injected into the superconductor film 1 and the "1" state is the "1" bit, and the opposite vortex is stored in the superconductor film 1 as "0" state. The vortex of the "0" state is stored to cancel the vortex of the "1" state, thereby achieving the zero-voltage state.

At the read operation, the magnetic flux due to vortices retained in the superconductor film 1 as the storage section is detected by the Josephson junction serving as the vortex detector. The threshold characteristic curve of the Josephson junction is shifted to the right or left as shown in FIG. 2 in accordance with the polarity of the vortex retained in the superconductor film 1. Therefore, the polarity of the vortex retained in the film 1 can be discriminated in accordance with the transport direction. This shift value of the threshold characteristics is determined by the number of vortex retained in the film 1. As shown in FIG. 2, while the bias current and the control current are respectively supplied to the superconductor layer 1A and the read control line 6, when the storage state is set to be "1", the operating point A is not included in the region surrounded by the curve c so that a voltage transition occurs in the Josephson junction 3. However, when the storage state is "0", the operating point A is included in the region surrounded by the curve b, and a voltage transition does not occur in the Josephson junction. Therefore, the state of the memory cell can be detected in accordance with appearance/disappearance of a voltage across the Josephson junction.

Since the detector Josephson junction is not formed in the storage region, the storage region can be reduced in size independently of the size of the detector Josephson junction, and the write current can be decreased.

According to the present invention, a state without the Abrikosov vortex is not used as bit information, but the polarities of the vortices are used as the "1" and "0" bit information. One of the vortices of opposite polarities in the saturated state is stored in the vortex storage region to represent the "1" or "0" information. Therefore, a data signal can be supplied to the memory cell irrespective of the previous cell storage state.

The erroneous operation caused by accumulation of the residual vortex in the repetitive "1" and "0" access can be eliminated, and since the vortex of the opposite polarity is stored in the film 1 until the film 1 is saturated therewith, the previous vortex does not remain in the film.

Variations in write current do not appear as variations in shift of the threshold characteristics since the vortex is stored until the superconductor film 1 is saturated therewith. Therefore, the write operation margin can be greatly increased.

FIGS. 6 and 7 show still another embodiment similar to that of FIG. 4. In FIG. 4, the superconductor layer 1A having a larger thickness than that of the superconductor film 1 is formed as a U-shaped layer, whereby diffusing from the storage region is prevented by the U-shaped layer. Therefore, saturating state is easily obtained. However, when a pinning force is strong, the structure of FIGS. 6 and 7 can be utilized. In this case, the vortex cannot be easily diffused and hence the diffusion limiting thick layer need not be formed.

The superconductor layer 1A constituting the lower electrode of a Josephson junction is formed near an edge away from an edge 5 of the superconductor film 1, which edge is adjacent to the write control line 4. The superconductor layer 1A is also substantially parallel to the control line 4. Other arrangements of the structure in FIGS. 6 and 7 are substantially the same as those in FIGS. 4 and 5.

In the embodiment previously described, the Josephson junction is formed on the comparatively thick superconductor layer 1A to prevent injection of the vortex under the Josephson junction.

The above description is concerned with the structure and operation of the basic memory cell of the embodiments. When a current is supplied to the storage region and a driving force acts on the vortex toward the Josephson junction due to the interaction between the current and the Lorentz force, high-speed writing and high-sensitivity detection can be achieved. This is because the vortex is transported to the storage region at a high speed by the driving force and the vortex near the Josephson junction is concentrated.

Figure 8:
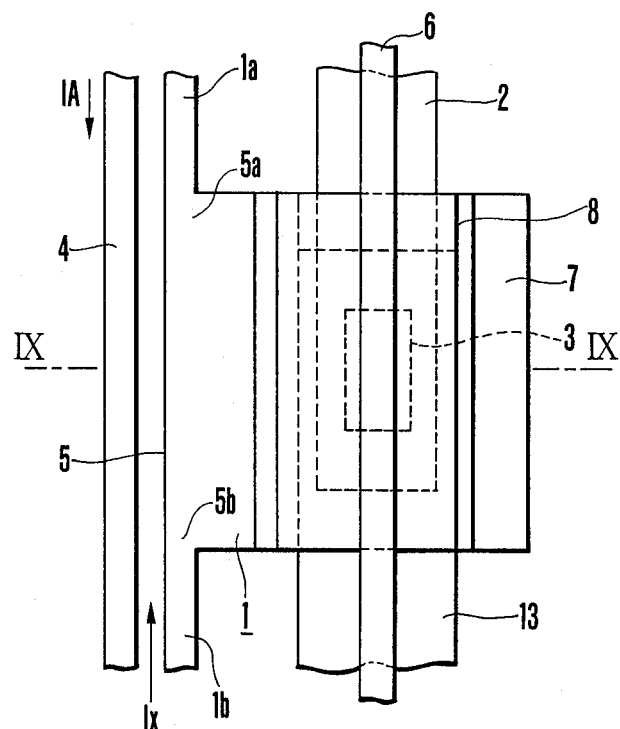
FIG. 8 is a plan view of a memory cell in a superconducting memory device according to still another embodiment of the present invention.
Figure 9:
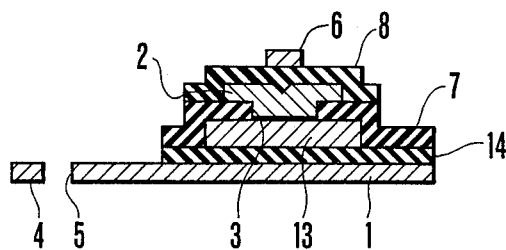
FIG. 9 is a sectional view of the memory cell taken along the line IX—IX of FIG. 8.

FIGS. 8 and 9 show a modification of the embodiment shown in FIG. 4. The Josephson junction is separated from the superconductor film 1 as the storage region. A write control line 4 is formed near one edge of a superconductor film 1 and is parallel therewith. A stripe-like superconductor layer 13 is formed on the superconductor film 1 through an insulating layer 14. The superconductor layer 13 is located near the edge of the film 1 parallel to the control line 4 and away therefrom and serves as a lower electrode. An insulating layer 7 is formed on the superconductor layer 13. A hole is formed in the insulating layer 7 at a position corresponding to the superconductor layer 13, and a superconductor layer 2 is formed on the insulating layer 7 through a thin tunnel barrier layer 3 formed in the hole. The superconductor layer 2 serves as the upper electrode and is parallel to the superconductor layer 13. A read control line 6 is formed on the superconductor layer 2 through an insulating layer 8 and is substantially parallel to the layers 2 and 13.

With the above structure, since the storage region for the vortex is electrically isolated by the insulating layer 14 from the lower electrode of the Josephson junction, the bias current of the Josephson junction is not supplied the superconductor film 1 as the storage region for the vortex. Therefore, the Lorentz current flowed between terminals 1a and 1b of the superconductor film 1 can be isolated from the bias current flowed in the superconductor layers 2 and 13. Even if the Lorentz current is used, a memory cell array can be constituted. With the arrangement described above, since the lower electrode of the Josephson junction is electrically isolated from the storage region, a superconductor material for the storage region can be freely selected. A material which is not normally used as the lower electrode of the Josephson junction as a storage section can also be used.

The influence of Lorentz current on the vortex will be described in more detail hereinafter. As is apparent from FIG. 8 in this embodiment, the Lorentz current supply lines 1a and 1b of superconductor stripes are respectively connected to two ends 5a and 5b of the edge 5 opposing the write control line 4 for the superconductor film 1 serving as the vortex storage region.

With the arrangement described above, when a write current for writing data "1", i.e., a current IA is supplied to the write control line 4, the vortex with a polarity corresponding to the upward direction with respect to the drawing plane is generated near the terminals of the superconductor film 1. At the same time, a current Ix is supplied from the line 1b to the line 1a, as shown in FIG. 8. The vortex generated in the storage region of the superconductor film 1 is driven with the Lorentz force, so that the vortex is transported from the edge 5 to the Josephson junction at high speed. As a result, the vortices are concentrated near the junction including the tunnel barrier layer 3. In the "0" write access mode, however, a current Ix having a polarity opposite to that in the "1" write access mode is flowed across the lines 1a and 1b. In this case, vortices with a polarity opposite to that of the vortices in the "1" write mode are transported near the junction including the tunnel barrier layer 3 by the same effect as described above. A large number of vortices are concentrated near the junction including the tunnel barrier layer 3. Therefore, the magnetic fluxes coupled to the junction are increased to improve detection sensitivity.

In the above embodiment, the write control line 4 and the Lorentz current lines 1a and 1b for supplying the Lorentz current can be used for selecting memory cells. In this case, a vortex with a predetermined polarity is generated in a memory cell where both the write control current and the Lorentz current are supplied. However, a vortex is not generated or the previous vortex is not inverted in a memory cell where one of the currents is supplied.

FIGS. 10 and 11 show still another embodiment similar to the memory cell shown in FIGS. 8 and 9. The upper electrode 2 constituting the Josephson junction in the vortex detector extends over the superconductor film 1 as the storage region beyond a side 13A of a superconductive layer 13 along the direction of width of the superconductor film 1. As is apparent from FIG. 7, insulating layers 7 and 14 are formed between the upper electrode 2 and the superconductor film 1.

In this embodiment, the superconductor layer 2 as the upper electrode of the Josephson junction opposes the superconductor film 1 in a wide area. The counter electrode 2 effectively guides the magnetic flux due to the Abrikosov vortex to the Josephson junction in accordance with the diamagnetic effect of the superconductor layer. The vortex detection sensitivity can be greatly improved. The write current can be made small and a sufficient operating margin required for the stable operation can be guaranteed. Therefore, a memory device of low power consumption and high speed can be provided. When the number of vortices generated by the superconductor film 1 is decreased by a degree corresponding to an increase in vortex detection sensitivity, the memory device can be made smaller, and the write current can be decreased.

Figure 12:
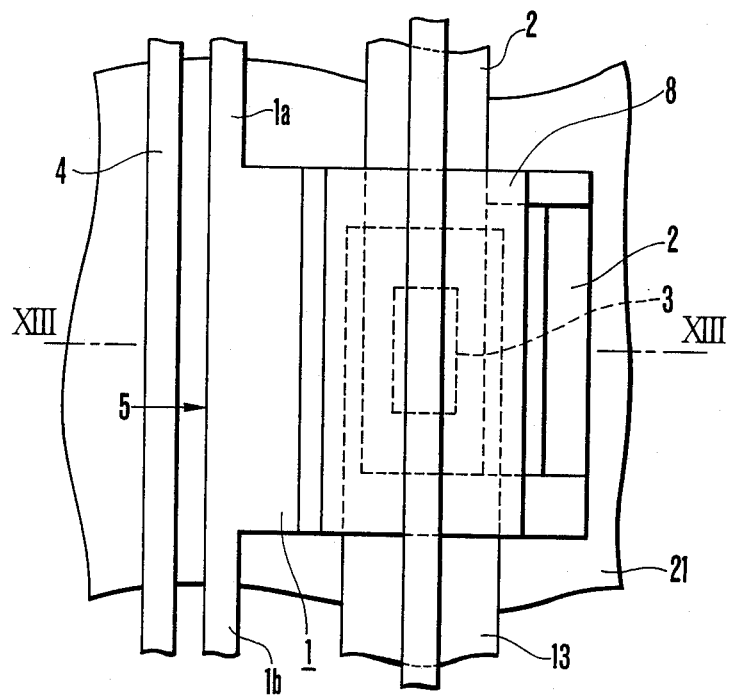
FIG. 12 is a plan view of a memory cell in a superconducting memory device according to still another embodiment of the present invention.
Figure 13:
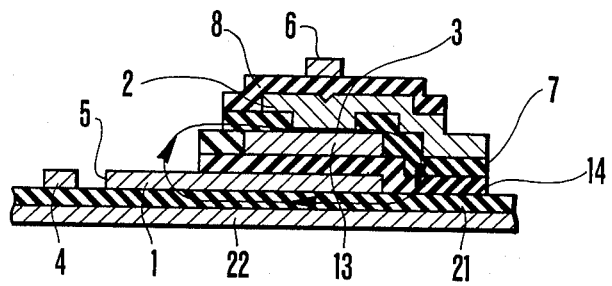
FIG. 13 is a sectional view of the memory device taken along the line XIII—XIII of FIG. 12.

FIGS. 12 and 13 show still another embodiment similar to FIGS. 10 and 11. Referring to FIGS. 12 and 13, a superconductor layer 22 constituting the ground plane is formed through an insulating layer 21 below a superconductor film 1 constituting the vortex storage region. An insulating layer 14 extends over parts of the film 1 and the layer 21. A superconductor layer 2 extends over the extended insulating layer 14 through an insulating layer 7.

With this arrangement, the superconductor layer 2 extends to the right from the right end of the superconductor film 1 as the vortex storage region. The superconductor layer 22 as the ground plane is isolated from the superconductor film 1 and extends below the superconductor film 1. For this reason, the magnetic flux due to vortices stored in the superconductor film 1 as the vortex storage region is guided through the insulating layers 21 and 7 due to the diamagnetic effect between the grounded superconductor layers 22 and 2 and then through a detector junction including a tunnel barrier layer 3, thereby forming a closed loop. Most of the magnetic fluxes due to vortices stored in the superconductor film 1 are coupled to the Josephson junction, especially, its junction, thereby further improving the vortex detection sensitivity. As a result, the read operation margin can be increased, the memory device can be made small, and power consumption can be decreased due to a decrease in write current.

Since the superconductor layer 2 extends along the write control line 4 edge of the superconductor film 1 as the storage region, the vortex detection sensitivity can be greatly increased.

FIGS. 14 and 15 show still another embodiment similar to FIGS. 8 and 9. The memory cell in FIGS. 14 and 15 is substantially the same as that in FIGS. 8 and 9, except that an edge 5 of the superconductor film 1 as the storage region near the write control line 4 is surrounded by a superconductor layer 31 except for a portion I through which the magnetic flux produced by the current supplied from the write control line 4 is injected. The vortex injection/diffusion rate of the superconductor layer 31 is smaller than that of the superconductor film 1. Furthermore, the superconductor layer 31 is formed on an insulating layer 14 and its ends except for the center extend from the edge 5 near the write control line 4. The ends are then bent toward a Josephson junction and are coupled to a superconductor layer 13 serving as the lower electrode of the Josephson junction. The superconductor layer 31 having such characteristics can be obtained such that its thickness is made larger than that of the superconductor film 1. With this structure, when a current flowed through the write control line 4 after data write operation is set to be zero to remove the magnetic flux acting on the superconductor film 1, diffused out of the vortex written in the film as the storage region is prevented by the superconductor layer 31 since most of the superconductor film 1 near the magnetic flux storage end is covered with the thick superconductor layer 31 which prevents injection of the magnetic flux. Therefore, most of the written vortices can be held in the superconductor film 1. As a result, vortex leakage is decreased and hence the number of vortices can be greatly increased. Therefore, threshold curve shift value is increased. The read operation margin can thus be greatly widened. Furthermore, with the structure of this embodiment, a superconductor with a small pinning center can be used to form the superconductor film 1, so that high-speed transport of the vortex can be achieved and hence the data write time can be shortened. Therefore, the operation cycle of the superconducting memory device can be shortened and high-speed operation can be achieved.

Furthermore, the storage region can be reduced correspondingly to an increase in operation margin, so that the current flowed through the superconductor film 1 can be decreased and low power consumption can be achieved. Referring to FIG. 14, the two ends of the edge 5 of the superconductor film 1 are respectively connected to bias current supply lines 1a and 1b for supplying the Lorentz current.

FIGS. 16 and 17 show still another embodiment similar to FIGS. 14 and 15. Referring to FIGS. 16 and 17, the superconductor layer 31 in FIGS. 14 and 15 is replaced with a superconductor layer 32 of a material whose lower critical magnetic flux Hcl (i.e., a value of a minimum magnetic flux required for injecting the magnetic flux in the superconductor) is large. The superconductor layer 32 consists of a pair of L-shaped superconductor layers 31a and 31b symmetrical about an edge 5 and formed except for the central portion of the edge 5 near a write control line 4 for the superconductor film 1 as the vortex storage region.

In this manner, by using a superconductor material with a large lower critical magnetic flux Hcl to constitute the superconductor layer 32, the vortices will not be emitted outside the superconductor film 1 during the data hold period in the same manner as in FIGS. 14 and 15. The read operation margin can be greatly increased. The operation cycle is shortened and the power consumption is decreased for the same reason as in the embodiment of FIGS. 14 and 15.

Figure 18:
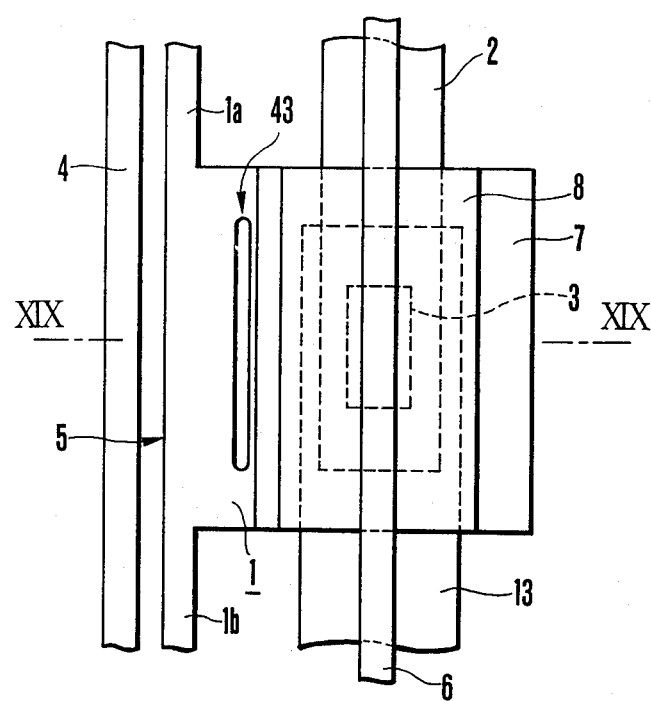
FIG. 18 is a plan view of a memory cell in a superconducting memory device according to still another embodiment of the present invention.
Figure 19:
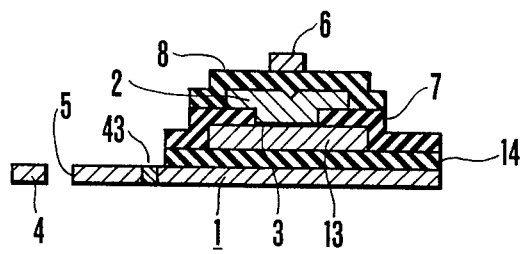
FIG. 19 is a sectional view of the memory device taken along the line XIX—XIX of FIG. 18.

FIGS. 18 and 19 show still another embodiment of a superconducting memory device according to the present invention. A weak superconductive or normal conductive region is formed in a superconductor film 1 for generating the vortex. Referring to FIGS. 18 and 19, a weak superconductive or normal conductive region 43 is formed near a Josephson junction formed near an edge of a square or rectangular superconductor film 1 spaced apart from an edge 5 near a write control line 4. The Josephson junction is substantially the same as that of FIGS. 8 and 9. The Josephson junction consists of a superconductor layer 13 formed on an insulating layer 14, parallel to the write control line 4 and serving as the lower electrode, and a superconductor layer 2 formed on a junction of a tunnel barrier layer 3 and serving as an upper electrode. A control line is formed on the superconductor layer 2 through an insulating layer 8. The region 43 is formed as a stripe near the Josephson junction and parallel to the write control line 4.

Methods of forming the weak superconductive or normal conductive region 43 will be described below. First, it can be formed such that a superconductor layer of the region 43 in the superconductor film 1 is removed or thinned by a patterning technique such as lift-off or etching.

Second, the weak superconductive or normal conductive region 43 can be formed such that the region 43 in the superconductor film 1 is damaged by ion implantation, or that the composition of the superconductor in the region 43 is modified to decrease its superconductivity.

Third, the weak superconductor or normal conductive region 43 can be formed such that a normal conductive metal is formed immediately above or below the region 43 in the superconductor film 1, and superconductivity of the region 43 is weakened by utilizing the proximity effect therebetween. Furthermore, any other technique can be utilized if superconductivity in this region can be weakened. For example, another material is used to formed the region 43.

Since the weak superconductive or normal conductive region 43 is formed near the Josephson junction in the superconductor film 1, most of vortices stored in the superconductor film 1 are concentrated in the region 43 in the write mode, so that the region 43 serves as a pinning center and the written vortices are concentrated in the region 43. This is because energy level is the lowest when the vortices are stored in the region 43 since the region 43 has weak superconductivity or normal conductivity. When most of the vortices are concentrated in the region 43, a threshold shift is greatly increased because the region 43 is located near the Josephson junction and magnetic coupling between the vortex and the Josephson junction is increased. The vortex detection sensitivity in the read mode can be greatly improved, and the read operation margin can also be greatly increased. When the vortex detection sensitivity in the data read mode is improved, the number of vortices to be written to store the same amount of data can be decreased. Therefore, the current level can be decreased and the power consumption can be decreased. Furthermore, the weak superconductive or normal conductive region 43 serves as a pining center with a largest pinning force within the superconductor film 1. Even if the pinning force in the superconductor film 1 excluding the region 43 is small, for example, zero, a large number of vortices can be generated by the region 43. The pinning force of the superconductor film 1 is minimized to transport the vortices at high speed within the superconductor. In this manner, high-speed transport of the vortex can be achieved, and the data write time can be shortened. Therefore, the superconducting memory device has an advantage by a short operation cycle time. Further, when the pinning force of the superconductor film 1 becomes near zero, the region 43 serves a strong pinning center to store the vortex and prevents the vortex from reescape. The written vortices are not substantially emitted again and can be effectively utilized, the area of the superconductor film 1 can be decreased, and the write current and hence the number of vortices can be decreased. As a result, the memory device can be made compact and has low power consumption.

Figure 20:
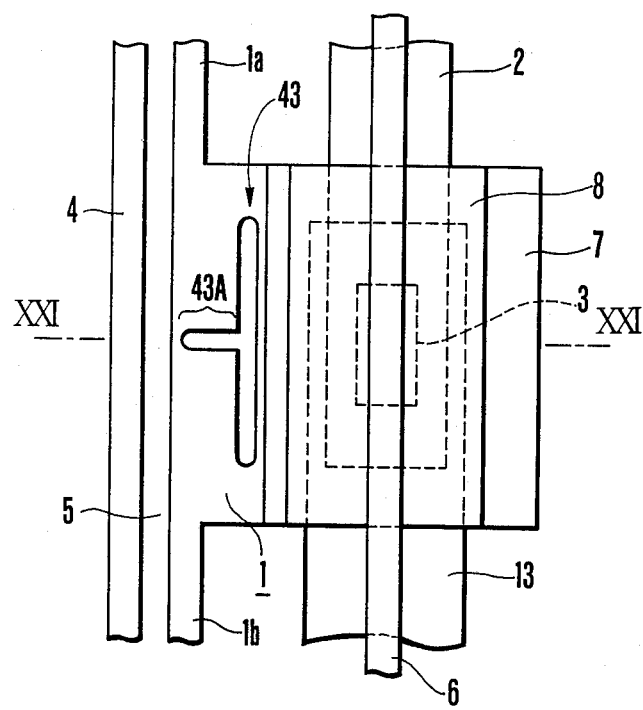
FIG. 20 is a plan view of a memory cell in a superconducting memory device according to still another embodiment of the present invention.
Figure 21:
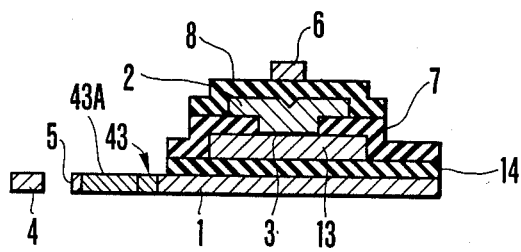
FIG. 21 is a sectional view of the memory device taken along the line XXI—XXI of FIG. 20.

FIGS. 20 and 21 show still another embodiment similar to FIGS. 18 and 19. The memory cell of FIGS. 20 and 21 is substantially the same as that of FIGS. 18 and 19, except that a weak superconductive or normal conductive region in the superconductor film 1 consists of a region 43 formed near a Josephson junction and a vicinity (i.e., a region 43A extending from the center of the portion 43 up to a vicinity of an edge 5 of a superconductor film 1) of a superconductor layer 4 as the write control line.

With this arrangement, the vortex generated near the edge 5 of the superconductor film 1 can be diffused throughout the region 43 at high speed through the weak superconductive or normal conductive portion in the region 43A extending near the edge 5 in the write mode. Unlike in FIGS. 1, 4 and 5, the vortex is not transported through the superconductor film 1 but through the weak superconductive or normal conductive region, thereby greatly increasing the transport speed. This is because a maximum value (i.e., a saturation speed) of the transport speed is small when superconductivity is strong upon transport of the vortex through the superconductor.

According to this embodiment, the vortex written in the edge 5 of the superconductor film 1 in the write mode travels through the elongated weak superconductive or normal conductive region 43A extending from the region 43 and reaches near the Josephson junction. The transport speed of the vortex is high and the data write time can be made short. Therefore, the operation cycle time in the memory device can be shortened, resulting in convenience.

Figure 22:
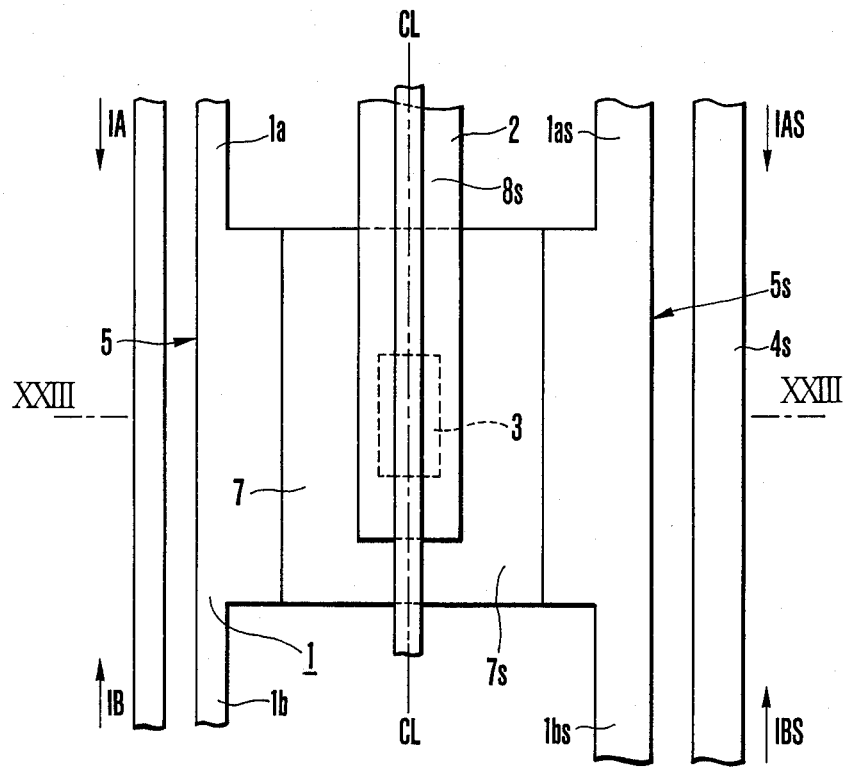
FIG. 22 is a plan view of a memory cell in a superconducting memory device according to still another embodiment of the present invention.
Figure 23:
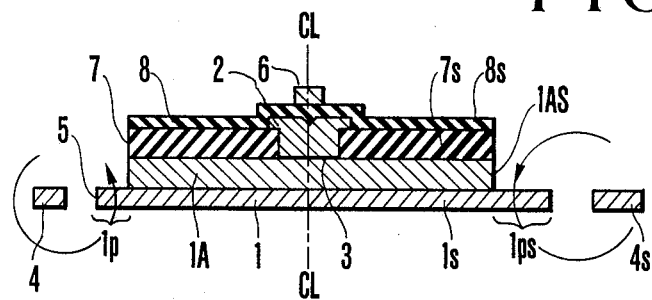
FIG. 23 is a sectional view of the memory device taken along the line XXIII—XXIII of FIG. 22.

FIGS. 22 and 23 show still another embodiment of a superconducting memory device according to the present invention. Vortex storage regions are formed at two sides of a Josephson junction. Referring to FIGS. 22 and 23, a right-side structure is symmetrical with a left-side structure about as a reference a line passing through a detector junction including a tunnel barrier layer 3 along the longitudinal direction of the drawing plane. Therefore, only the left-side structure will be described, and the same functions as those of the left-side structure are illustrated with an affix S in the right-side structure.

A write control line 4 of a superconductor is formed near a left edge 5 of a square or rectangular superconductor film 1 for holding the vortex. Superconductor lines 1a and 1b are connected to the two ends of the left edge 5 of the superconductor film 1 therealong. A superconductor layer 1A serving as a lower electrode of the Josephson junction is formed to the right of and parallel to the left edge 5 at a distance therefrom. An insulating layer 7 is formed on the superconductor layer 1A. A superconductor layer 2 as an upper electrode is formed on the tunnel barrier film 3 formed in a hole of the insulating layer 7, so that the superconductor layer 2 is in contact with the film 1 through the tunnel barrier layer 3. A read control line 6 is formed on the superconductor layer 2 through an insulating layer 8. It should be noted that the insulating layers 8 and 8S are not shown in the plan view of FIG. 22 for illustrative convenience.

The operation of the memory cell having the structure described above will be described hereinafter. Currents IA and IAS corresponding to data "1" are respectively supplied to the write control lines 4 and 4S in the first direction to generate a magnetic flux corresponding to data "1", thereby completing writing of data "1". In this case, the magnetic flux generated by the write control line 4 is applied to a storage region 1P adjacent to the left edge 5 of the superconductor film 1 for storing the vortex. The magnetic flux has a polarity corresponding to the upward direction with respect to the drawing plane in accordance with the Ampere rule in FIG. 23. The magnetic flux generated by the write control line 4S is applied to a storage region 1PS with a polarity corresponding to the downward direction with respect to the drawing plane. As a result, a vortex with the upward magnetic component is generated in the data storage region 1P, and a vortex with the downward magnetic component is generated in the data storage region 1PS. When currents IB and IBS corresponding to data "0" are respectively supplied to the write control lines 4 and 4S in a direction opposite to that of the currents IA and IAS, a magnetic flux with a polarity opposite to that of the "1" data magnetic flux is generated. "0" data vortices having magnetic components opposite to those of the "1" data vortices are stored in the data storage regions 1P and 1PS. More particularly, the vortex of the downward component is stored in the data storage region 1P, and the vortex with the upward component is stored in the data storage region 1PS. The behavior of the vortices in the transition from the "1" state to "0" state is identical in each previous embodiment.

The memory state detection process is the same as that of the previous embodiment, and a detailed description thereof will be omitted. According to this embodiment, the vortices with opposite polarities are stored in the first and second storage regions 1P and 1PS to constitute one storage state. The coupled magnetic flux from the vortices in the first storage region 1P and the coupled magnetic flux from the vortices in the second storage region 1PS are identically directed in the Josephson junction as the detecting section. As a result, the vortices in these storage regions are strongly magnetically coupled. The magnetic fluxes coupled to the junction including the tunnel barrier layer 3 are stronger than those of FIGS. 4 and 5. In this embodiment, the magnetic flux due to the vortex held in the two data storage regions of the superconductor film effectively crosses the Josephson junction of the data readout section. Vortex detection sensitivity is increased, and the read operation margin is increased. Since the number of vortices can be decreased, the write current and power consumption can be decreased. A decrease in write current leads to a decrease in operation level of peripheral circuits, thereby achieving high-speed operation.

Figure 24:
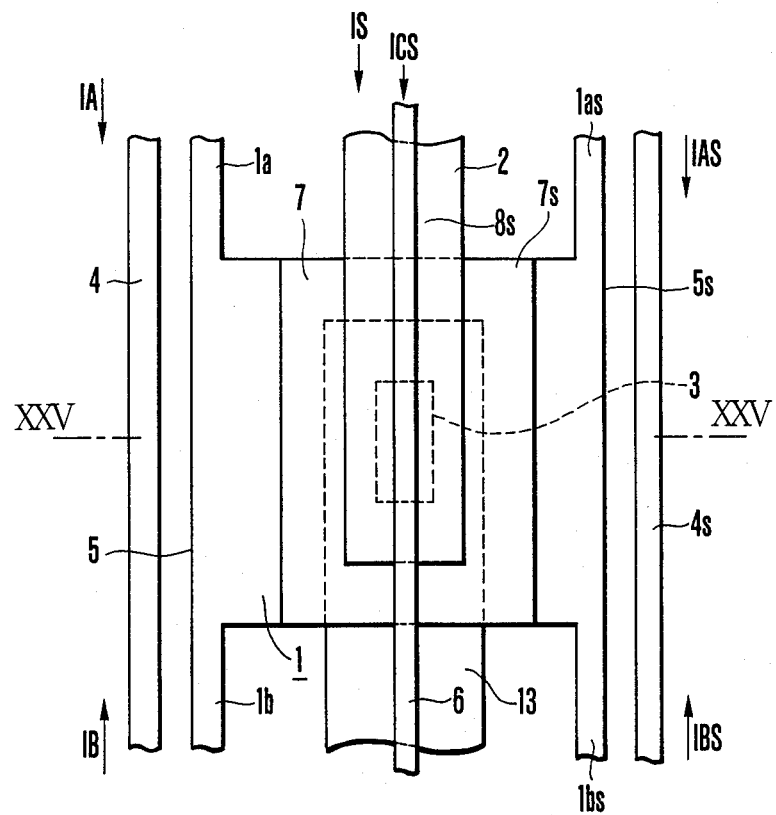
FIG. 24 is a plan view of a memory cell in a superconducting memory device, according to still another embodiment of the present invention.
Figure 25:
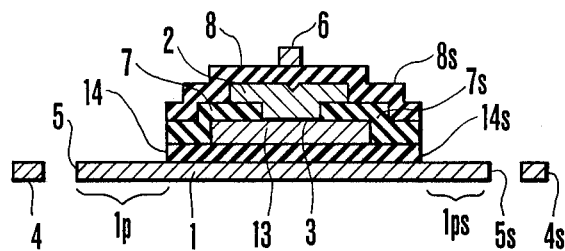
FIG. 25 a sectional view of the memory device taken along the line XXV—XXV of FIG. 24.

FIGS. 24 and 25 show still another embodiment, wherein an insulating layer 14 (FIGS. 8 and 9) is formed between the lower electrode 1A of the Josephson junction of FIGS. 22 and 23 and the superconductor film 1 serving as the vortex storage region. Other arrangements in FIGS. 24 and 25 are substantially the same as those of FIGS. 22 and 23.

Since the lower electrode is not electrically connected to the superconductor film 1, vortex storage regions 1P and 1PS are not completely defined at the portion of the lower electrode, unlike in FIGS. 22 and 23, so that the storage regions slightly extend into the region immediately under the lower electrode. The basic operation of the memory cell in FIGS. 24 and 25 is substantially the same as in FIGS. 22 and 23. Therefore, high detection sensitivity can be obtained in the same manner as in FIGS. 22 and 23. By adapting the structure of this embodiment, a current can be supplied to cause the vortex to come closer to the detector junction without preventing the detection for the superconductor film 1. By utilizing this feature, detection sensitivity can be improved, power consumption is decreased, and high-speed operation is performed, but a detailed description thereof will be omitted since such a description is made in association with FIGS. 8 and 9. It should be noted that insulating layers 8 and 8S are omitted in the plan view of FIG. 24 for illustrative convenience.

Figure 26:
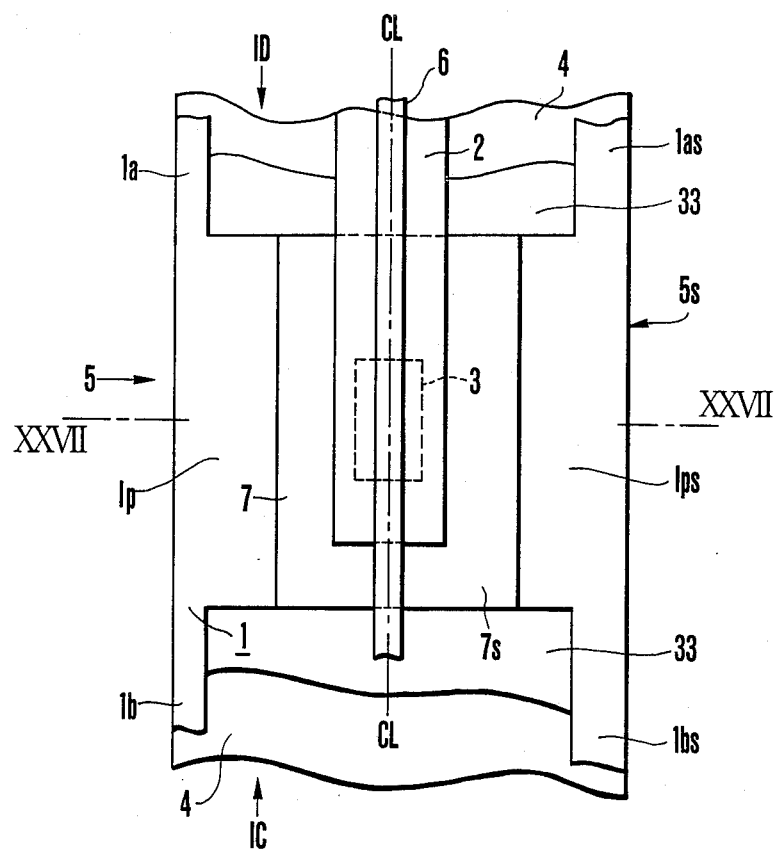
FIG. 26 is a plan view of a memory cell in a superconducting memory device according to still another embodiment of the present invention.
Figure 27:
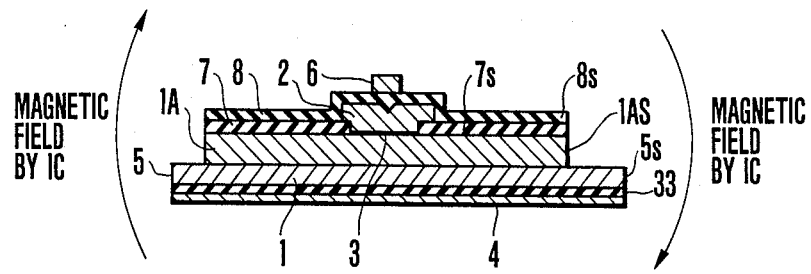
FIG. 27 sectional view of the memory device taken along the line XXVII—XXVII of FIG. 26.

FIG. 26 and 27 show still another embodiment similar to that of FIGS. 22 and 23. The memory cell in FIGS. 26 and 27 is substantially the same as that of FIGS. 22 and 23, except that a write control line 4 of a superconductor is formed through an insulating layer 33 under a superconductor film 1 for storing the vortex.

A magnetic flux generated upon supply of a current IC in the write control line 4 has a profile shown in FIG. 28. When a magnetic flux with a polarity directed upward is applied to a storage region 1P, a magnetic flux with a polarity detected downward is applied to a storage region 1PS. It is readily understood that the magnetic fluxes can be generated in the same manner as in the case where the currents are supplied to the write control lines 4 and 4S of FIGS. 22 to 25, and a detailed description thereof will be omitted. Currents IC and ID are flowed in the write control line 4 to write "1" and "0" data in the same manner as in FIGS. 22 and 23. Therefore, high sensitivity detection can be achieved in the same manner as in FIGS. 22 to 25. It should be noted that insulating layers 8 and 8S are omitted in the plan view of FIG. 26 for illustrative convenience in the same manner as in FIGS. 22 and 24.

In this embodiment, the superconductor film 1 and the superconductor layer 1A are electrically connected. However, an insulating layer may be formed between the superconductor film 1 and the superconductor layer 1A. In this embodiment, the write control line 4 is formed immediately under the superconductor film 1 as the storage region. However, the write control line 4 may be formed to cover the entire surface of the junction to obtain the same effect. The write control line 4 need not be a wide film but can be constituted by a stripe line.

Furthermore, in this embodiment, the detector junction is equidistantly apart from the respective storage regions, and vortices with opposite polarities are stored in the write control line. However, it is essential to additionally apply coupled magnetic fluxes from the vortices in the two storage regions to the Josephson junction, so that any structure can be implemented. The superconductor film 1 with the two storage regions is limited to a single film. However, the two storage regions may be formed in separate superconductor films. In this case, the separate superconductor films need not be formed on a single plane. They may be parallel or perpendicular to each other. The detection sensitivity position need not be set to be an intermediate position between the two storage regions. Furthermore, the vortices stored in these storage regions need not have opposite polarities on an identical plane.

FIGS. 28 and 29 show still another embodiment of the present invention. Unlike the previous embodiments, the write control line is eliminated, and a vortex is written using a self-field of the current flowed in the storage region, instead of the write control line. Referring to FIGS. 28 and 29, a superconductor film 1 for holding the vortex comprises a type-II superconductor, and its shape is square or rectangle. A superconductor layer 13 is formed on the superconductor film 1 through an insulating layer 14 and is adjacent to one edge thereof. The superconductor layer 13 is substantially parallel to the insulating layer 14. The superconductor layer 13 constitutes the lower electrode of a Josephson junction. A superconductor layer 2 serving as the upper electrode is formed on the superconductor layer 13 through a junction of a tunnel barrier layer 3 and is parallel to the superconductor layer 13. A read control line 6 is formed on the superconductor layer 2 through an insulating layer 8. The surface of the superconductor layer 13 excluding the junction is covered with an insulating layer 7. Current terminals 1a and 1b are connected to two ends of an edge opposite to the Josephson junction edge of the superconductor film 1 to supply a write current to the superconductor film 1.

Data "1" can be written in the following manner. A current IA corresponding to data "1" is supplied to a write current terminal in a superconductor film 1 to generate a magnetic flux corresponding to data "1", i.e., a clockwise (when viewed from the top of FIG. 29) magnetic flux in accordance with the Ampére law. This magnetic flux is applied to the vortex storage region in the superconductor film 1. As a result, a vortex having a magnetic component with an upward polarity is generated. On the other hand, data "0" can be written in the following manner. A current IB corresponding to data "0" is supplied to the write current terminal 1b of the superconductor film 1 in a direction opposite to that of the current IA, so that a magnetic flux having a polarity opposite to that for the data "1" is generated by the current IB in accordance with the Ampére law. A vortex corresponding to data "0" is stored in the superconductor film 1 in the form with a magnetic component having a polarity opposite to that for data "1", i.e., in the form wherein the magnetic component with a downward magnetic component is stored in the data storage region as the superconductor film 1. The behavior of the vortex in the transition from the "1" state to the "0" state is the same as that in the conventional operation. More specifically, a current (IA or IB) is directly supplied to the superconductor film 1 to set the data memory state in the same manner as in FIGS. 8 and 9. A description on detection of the memory state will be omitted, but the same operation as in FIGS. 8 and 9 can be performed.

In the above embodiment, since currents corresponding to the data "1" and "0" are supplied to the superconductor film 1 to generate the same magnetic fluxes obtained by the currents used in FIGS. 8 and 9, the superconductor layer 14 formed separated from the storage region can be omitted. Therefore, this embodiment provides an advantage in that the cell area can be decreased as compared with the case of FIGS. 8 and 9.

In addition to application of the magnetic flux generated by the current IA, the vortex generated in the storage region of the superconductor film 1 also receives a Lorentz force in accordance with the left-hand rule. In this case, the vortex is transported at high speed in a direction (i.e., upward when a junction including a tunnel barrier layer 3 is viewed from an edge 5 of the vortex storage region) perpendicular to the direction of the current IA and is then transported near the Josephson junction. In the "0" data write mode, the write current IB is supplied to a direction opposite to that in the "1" data write mode. In this case, a vortex with a polarity opposite to that of the "1" data vortex is transported to the vicinity of the Josephson junction at high speed. Therefore, the vortices are accumulated near the junction at high speed, thereby achieving high-speed write access. Since the vortices are accumulated near the junction, detection sensitivity of the Josephson junction can be improved. As a result, the detection margin for the data storage state can be improved, and no operation error occurs, thus obtaining additional advantages.

With the above arrangement, the data write control line can be used together with the superconductor as the data storage region to decrease the number of wiring lines in memory cells, thereby achieving a high integration density. Furthermore, when the memory cells are used to constitute a memory cell array, the wiring line length can be shortened to decrease the wiring delay. At the same time, a Lorentz force for driving the vortex is supplied to the memory cell, so that the operation speed can be increased.

Figure 30:
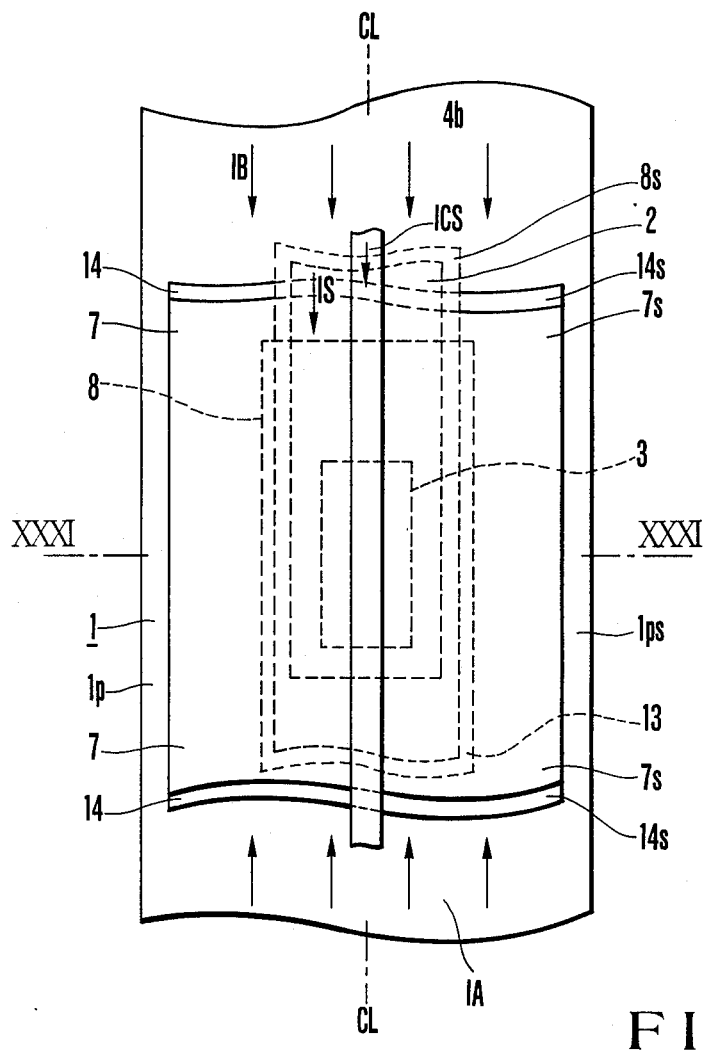
FIG. 30 is a plan view of a memory cell in a superconducting memory device according to still another embodiment of the present invention.
Figure 31:
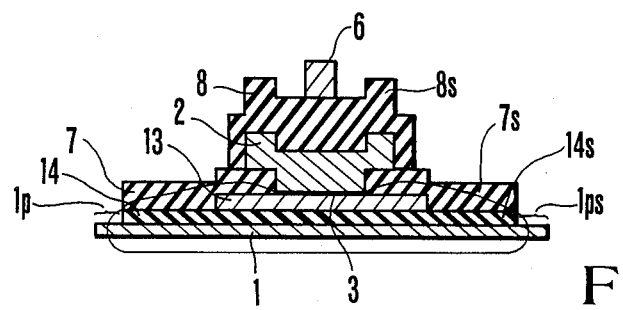
FIG. 31 is a sectional view of the memory device taken along the line XXXI—XXXI of FIG. 30.

FIGS. 30 and 31 show still another embodiment similar to that of FIGS. 28 and 29. The right-side structure is symmetrical with the left-side structure about as a reference line CL a line passing the center of a detector junction 3 of a Josephson element along the longitudinal direction of the drawing. The left-side structure in FIGS. 30 and 31 is substantially the same as that of FIGS. 28 and 29, and the same reference numerals in FIGS. 30 and 31 denote the same parts as in FIGS. 28 and 29. The components of the right-side structure are represented with the corresponding left-side components with an affix S. A width of each of current terminals 1a and 1b formed at two ends of an edge 5 of a superconductor film 1 is the same as that of the film 1 in FIGS. 30 and 31, unlike in the embodiment of FIGS. 28 and 29.

The basic operation of the superconducting memory device of this embodiment is given as follows. A current IA corresponding to data "1" is supplied to the write current terminal 1a. Upon supply of the current IA, a clockwise (when viewed from the upper surface of the drawing) magnetic flux is generated in accordance with the Ampére law. A magnetic flux with a polarity upward with respect to the drawing surface is applied to a storage region 1P of the superconductor film 1. Therefore, a vortex having a magnetic component with an upward polarity is generated in the data storage region 1P. A magnetic flux with a polarity corresponding a downward direction with respect to the drawing surface is applied by the current IA to a data storage region 1PS. Therefore, a vortex having a magnetic component with a downward polarity is generated in the data storage region 1PS. On the other hand, in the "0" data write mode, the current IB corresponding to data "0" is supplied to the write current terminal 1b in the superconductor film 1. In this case, a magnetic flux with a polarity corresponding to the downward direction with respect to the drawing surface is applied to the storage region 1P in accordance with the Ampére law. Unlike in the "1" data write mode, the vortex having a magnetic component corresponding to the downward direction with respect to the drawing surface is generated in the storage region 1P. A magnetic flux with a polarity corresponding to the upward direction with respect to the drawing surface is applied to the storage region 1PS. Therefore, the vortex having a magnetic component with a polarity corresponding to the upward direction with respect to the drawing surface is generated in the storage region 1PS.

A description concerning detection of the memory state is omitted, but the same operation as in FIGS. 28 and 29 can be performed. Since the polarities of the magnetic fluxes based on the vortices stored in the storage region 1P and 1PS are opposite to each other, the clockwise magnetic flux is additionally applied to the storage region in the "1" state. However, the counter-clockwise magnetic flux is additionally applied to the storage region in the "0" state. Magnetic fluxes from the two storage regions 1P and 1PS coupled to the junction are increased in this embodiment. As a result, a higher detection sensitivity can be obtained as compared with the previous embodiments. The detection margin for the storage state is increased, and no operation error occurs.

Figure 32:
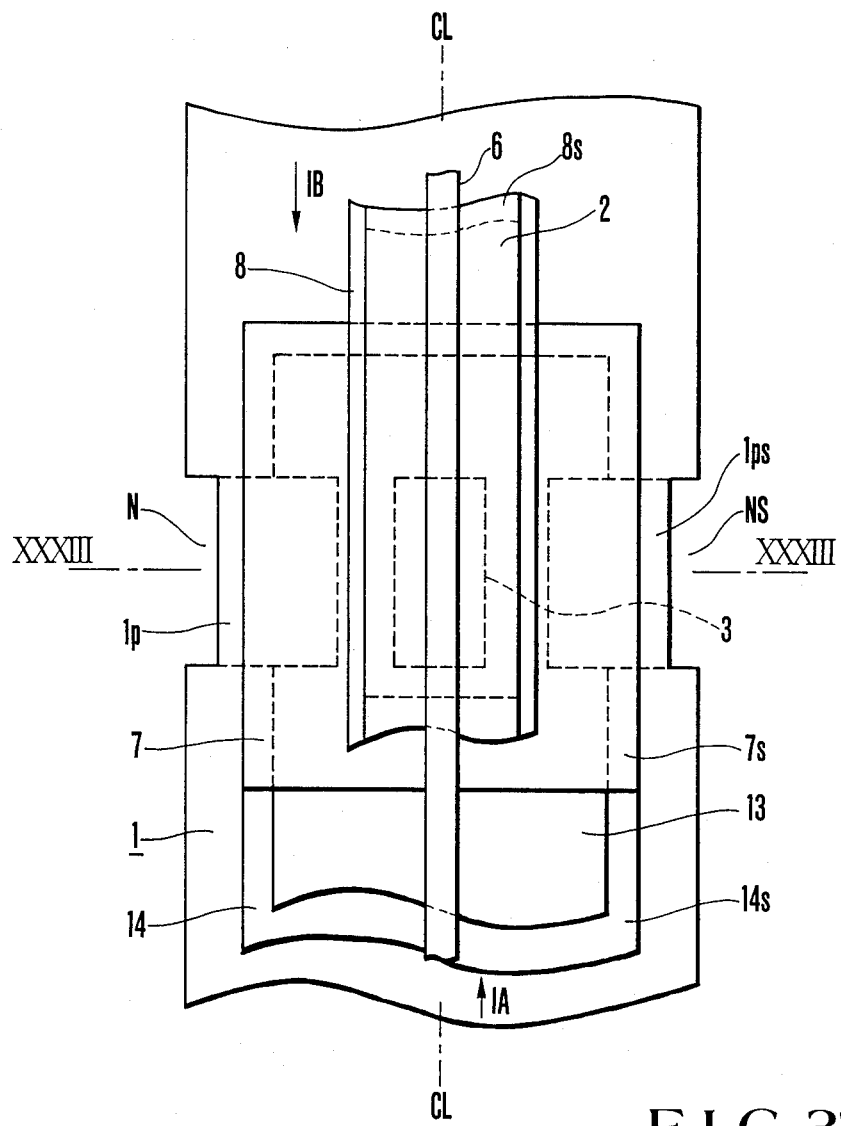
FIG. 32 is a plan view of a memory cell in a superconducting memory device according to still another embodiment of the present invention.
Figure 33:
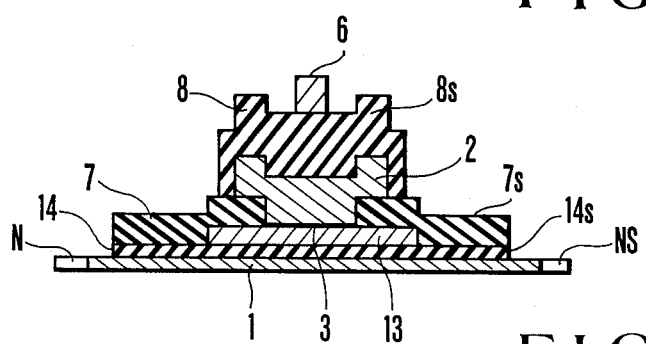
FIG. 33 is a sectional view of the memory device taken along the line XXXIII—XXXIII of FIG. 32.

FIGS. 32 and 33 show still another embodiment similar to that of FIGS. 30 and 31. The device of FIGS. 32 and 33 is substantially the same as that of FIGS. 30 and 31, except that parts N and NS of a superconductor film 1 are narrowed to define vortex storage regions 1P and 1PS, and that a width of a portion of a superconductor layer 13 which constitutes a lower electrode of a Josephson junction corresponding to the storage regions 1P and 1PS is narrowed.

The basic operation of the memory device in FIGS. 32 and 33 will be described. The "1" and "0" data write operations and data detection are substantially the same as those in FIGS. 30 and 31. However, since the storage region 1P is defined by a superconductor layer 1A, the vortices in the superconductor film 1 can hardly be injected in the superconductor layer 13 even through the write currents IA and IB are increased. For this reason, the number of vortices stored in the storage region is kept constant. In other words, the operating points causing the write saturation effects in the devices of FIGS. 30 and 31 and FIGS. 32 and 33 differ from each other. Since the width of the write current terminals 1a and 1b is greater than that of the storage regions 1P and 1PS and the Josephson junction, the currents IA and IB supplied to the superconductor film 1 has a higher density at the storage regions 1P and 1PS in the superconductor film 1. For this reason, the magnetic flux is strong near only the storage region, and vortices are generated in only the storage regions 1P and 1PS. As a result, operation failure caused by generation of the vortex at a portion excluding the storage regions can be prevented. Further, since the memory cell can be driven at a low current, peripheral circuits for a memory array constituted by the memory cells can be made compact, and high-speed operation can be performed.

In the above embodiment, the write control line is not used. However, when a memory cell array is prepared and write cell selection is performed, one selection line is constituted by the superconductor film 1, and the other selection line is constituted by a read control line 6 as a superconductor layer 2 or another superconductor layer which is formed under the superconductor film 1 to be electrically insulated therefrom.

In the above embodiment, it is readily understood that the vortex is generated in only the data storage region even if the thickness of a superconductor film 1 portion excluding the storage regions 1P and 1PS is increased. In this embodiment, the detector junction is equidistantly spaced apart from the respective storage regions, and the memory regions 1P and 1PS store the vortices of opposite polarities. However, when the coupled magnetic fluxes due to the vortices in the two storage regions are additionally applied to the detecting section, any structure can be adapted. For example, the two storage regions may be three-dimensionally located to be parallel or perpendicular to each other. Furthermore, the vortices need not be stored to have opposite polarities on an identical plane. The two storage regions are formed in the single superconductor film 1. However, two different superconductor layers may be used to constitute separate storage regions. Furthermore, the sensitivity detection position need not be at the same distance from the two storage regions.

The relationship between the superconductor and the magnetic flux will be considered with reference to FIGS. 34 and 35A and 35B. Referring to FIGS. 34 and 35A and 35B, reference symbol MI denotes a magnetic insensitive region; and CL, a central line of a superconductor layer M along the normal direction.

FIG. 34 shows the lines of magnetic force when a uniform magnetic flux H is applied to the superconductor layer M from the upper surface to the lower surface of the drawing. As is apparent from the solutions of Maxwell field equations, the magnetic flux H is divided into the right and left magnetic components on the superconductor layer with respect to a central line cL in accordance with the Meissner effect inherent in the superconductor. More particularly, when a uniform magnetic flux is applied, right-directed lines of magnetic force are present at the right side of the central line cL normal to the superconductor layer M. Left-directed lines of magnetic force are present at the left side of the central line cL. The direction of parallel lines of magnetic force is changed at the central portion, and the magnetic flux at the central portion is very weak. A region to which a small parallel magnetic flux is applied is defined as the magnetic insensitive region MI. A Josephson junction formed on the superconductor layer M and having the surface thereof as a junction detects only magnetic fluxes which are parallel to the surface of the superconductor layer M. When the Josephson junction is formed at the region (i.e., the magnetic insensitive region MI) where the direction of the parallel magnetic lines of force is changed, the applied magnetic fluxes cannot be coupled to the junction of the Josephson element. As a result, the intersection between the superconductor layer M and the central line cL serves as the magnetic insensitive region MI which is free from influences of the magnetic flux in FIG. 34.

FIGS. 35A and 35B respectively show cases wherein a write control line W is located in the same plane as that of the superconductor layer M and is located in a plane different from the superconductor layer M. The magnetic flux is applied by the write control line W to the superconductor layer M. The positions of the magnetic insensitive regions MI in these cases are easily determined by simulation such as calculations by Maxwell field equations or the definite element method. The magnetic insensitive region MI in FIG. 35A is slightly deviated toward the write control line W from the center of the superconductor layer M. The magnetic insensitive region MI in FIG. 35B is larger than the central portion of the superconductor layer M on the surface (i.e., the upper surface of the superconductor layer M in FIG. 35B) located on the same side of the write control line W and is slightly deviated from the central portion to be separated from the line W. At the same time, the magnetic insensitive region MI in FIG. 35B is larger than the central portion of the superconductor layer M on the surface (i.e., the lower surface of the superconductor layer M in FIG. 35B) located on the edge opposite to the line W and is slightly deviated toward the line W from the central portion.

Figure 36:
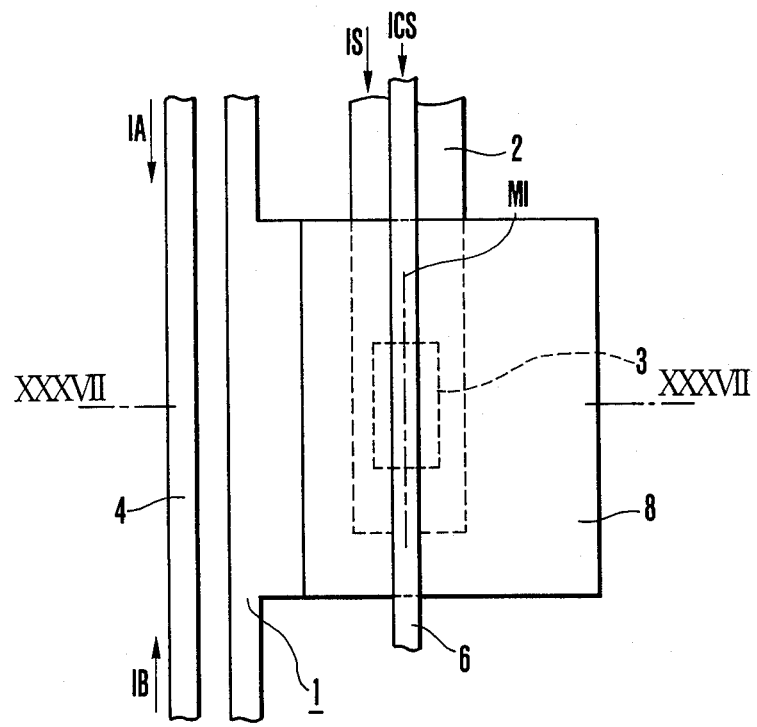
FIG. 36 a plan view of a memory cell in a superconducting memory device according to still another embodiment of the present invention.
Figures 37A, 37B:
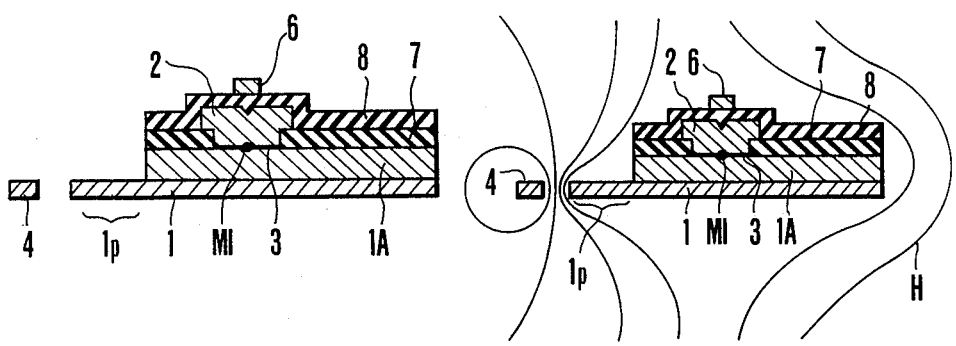
FIGS. 37A and 37B are respectively sectional views showing the structure taken along the line XXXVII- —XXXVII of FIG. 36 and explaining the relationship between the magnetic flux and the insensitive region.

FIGS. 36, 37A and 37B show still another embodiment of the present invention in consideration of the relationship between the magnetic flux and the magnetic lines of force. Referring to FIGS. 36, 37A and 37B, a junction including a tunnel barrier layer 3 must be located at a position at which the magnetic flux from a write control line 4 is not directly applied. Otherwise, the Josephson junction is erroneously operated by the coupled magnetic fluxes for the junction and is maintained in a high voltage state although the Josephson junction is held in the "1" or "0" state. For this reason, the data read access must be started after completion of data write access is detected. A sufficient margin is required for such detection, and hence the operation speed cannot be increased. Furthermore, a timing circuit is complicated, resulting in inconvenience.

In this embodiment, the center of the tunnel barrier layer 3 of the Josephson junction is aligned with the magnetic insensitive region, i.e., the region where lines of magnetic force parallel to the surface of the superconductor film 1 are absent when the current corresponding to the data is supplied to generate the corresponding lines of magnetic force.

The basic operations (data write and read operations) of the memory cell of this embodiment are the same as those of the previous embodiments, and a detailed description thereof will be omitted. However, according to this embodiment, as is apparent from FIG. 37B, the data readout section, i.e., the Josephson junction including the tunnel barrier layer 3 is located at a position free from the direct influence of the magnetic flux generated in response to the write current. Even if write access for one of the memory cells in the memory cell matrix is performed, it does not adversely influence the remaining memory cells. In this sense, data read access for one of the remaining memory cells can be performed while data is being written in the selected memory cell. When the vortex is stored in the storage region 1P in the superconductor film 1, the applied magnetic flux is superposed on the magnetic flux of the vortex, so that the applied magnetic flux is not substantially interfered with by the magnetic flux of the vortex. Therefore, even if the vortex is stored in the storage region, the same effect as described above can be obtained. The memory cycle time can be shortened as compared with those of the previous embodiments. The memory can be operated at a higher speed.

In this embodiment, the superconductor film 1 is electrically connected to the superconductor layer 1A constituting the lower electrode of the Josephson junction. However, an insulating layer may be formed between the superconductor film 1 and the superconductor layer IA. In the above embodiment, the center of the Josephson junction is aligned with the magnetic insensitive region MI on the superconductor film 1. However, such an alignment need not be performed. In this case, the Josephson junction including the tunnel barrier layer 3 crosses over the magnetic insensitive region MI. Alternatively, a plurality of write control lines may be used. In this case, the Josephson junction is located at a region where the magnetic flux is cancelled by the currents supplied to the plurality of write control lines.

Figure 38:
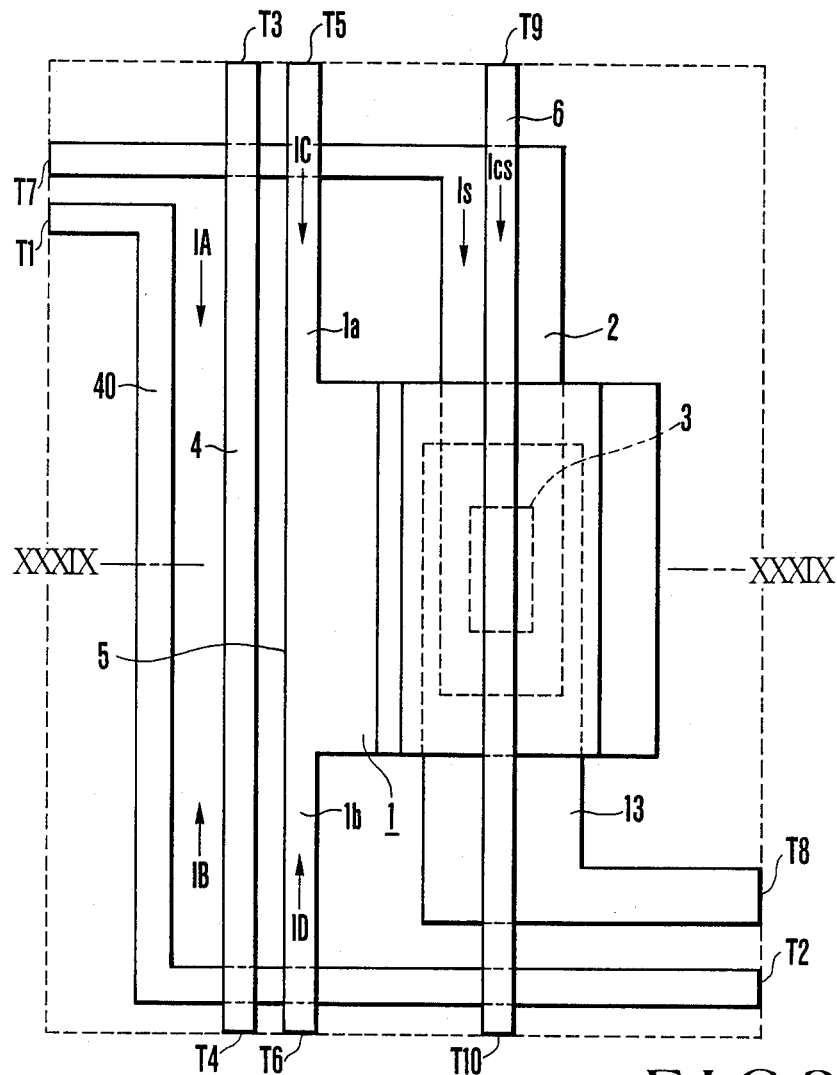
FIG. 38 is a plan view of a memory cell in a superconducting memory device according to still another embodiment of the present invention.
Figure 39:
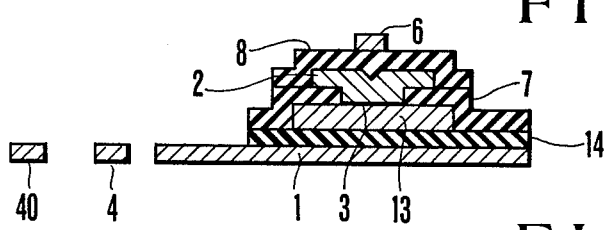
FIG. 39 is a sectional view of the memory device taken along the line XXXIX—XXXIX of FIG. 38.

FIGS. 38 and 39 show still another embodiment of a superconducting memory device, i.e., a cell array represented by one memory cell. Referring to FIGS. 38 and 39, a second write control line 40 of a superconductor layer is formed as the data write section in addition to a first write control line 4. The second write control line 40 is parallel to the first write control line 4. The control line 4 extends along the word line and terminates into terminals T3 and T4 at the ends of the memory cell. Two ends of the control line 40 extend along the bit line and terminate into terminals T1 and T2 at the ends of the memory cell. A square or rectangular superconductor film 1 is formed near the first and second control lines 4 and 40 and serves as a storage region for storing the vortex. Lorentz current lines 1a and 1b are connected to two ends of an edge 5 of the superconductor film 1 which is located near the control lines 4 and 40 and parallel thereto. The Lorentz current lines 1a and 1b extend along the word line and constitute terminals T5 and T6 at the ends of the memory cell. A Josephson junction is formed near an edge of the superconductor film 1 which is opposite to the edge 5. A superconductor layer 13 serving as the lower electrode of the Josephson junction is formed on the superconductor film 1 through an insulating layer 7. A superconductor layer 2 serving as the upper electrode is formed on the superconductor layer 13 through a tunnel barrier layer 3. A read control line 6 is formed on the superconductor layer 2 through an insulating layer 8. The superconductor layer 13 serving as the lower electrode of the Josephson junction extends along the bit line and constitutes a terminal T8 at the end of the memory cell. The superconductor layer 2 serving as the upper electrode extends as a bias current line along the bit line and constitutes a terminal T7 at the end of the memory cell. The read control line 6 extends along the word line and constitute terminals T9 and T10 at the ends of the memory cell.

Figure 40:
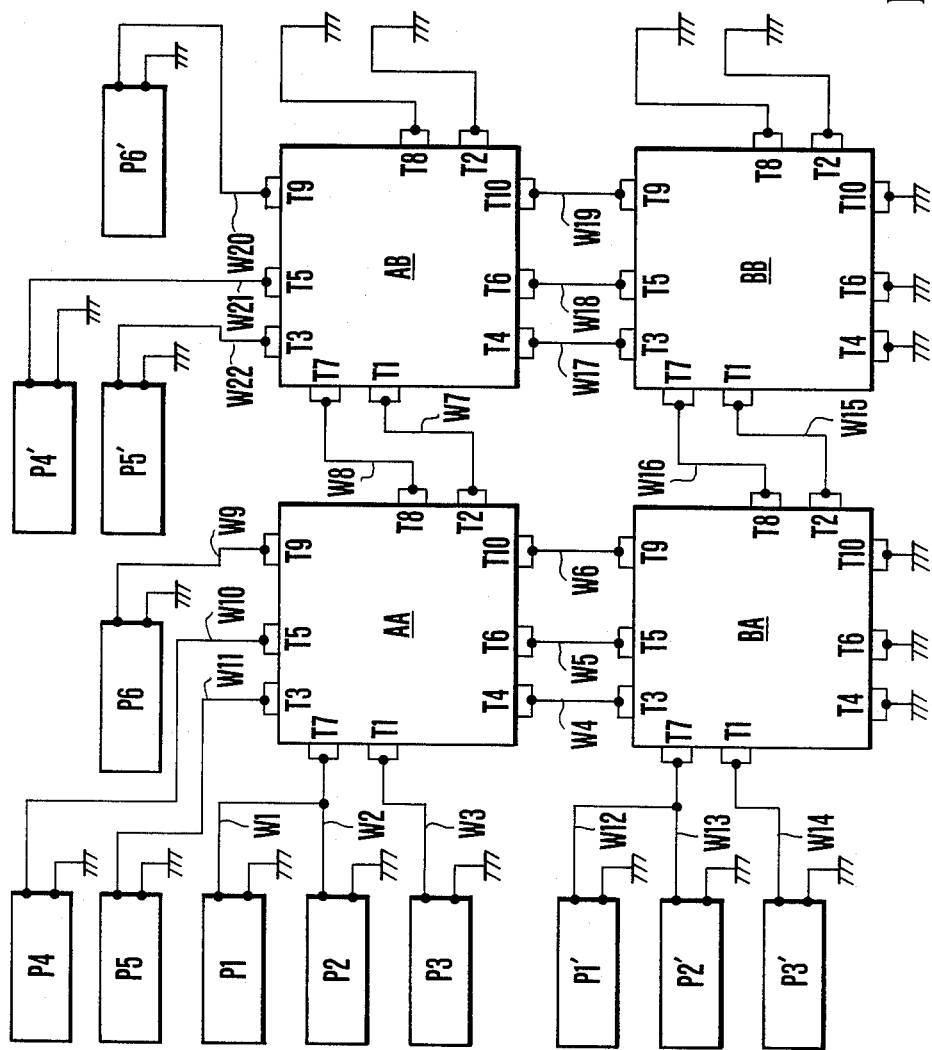
FIG. 40 is a wiring diagram showing a 4-bit memory cell matrix using the memory cell shown in FIGS. 38 and 39.

FIG. 40 shows a 4-bit memory cell array of 2 rows×2 columns by using the memory cells of FIGS. 38 and 39.

In a memory cell AA of the first row and the first column, a terminal T7 is connected to a current supply section P1 through a wiring W1 and to a sense circuit P2 through a wiring W2. A terminal T1 is connected to a write bit current supply section P3 through a wiring W3. A terminal T3 is connected to a write word current supply section P5 through a wiring W11. A terminal T5 is connected to a Lorentz current supply section P4 through a wiring W10. A terminal T9 is connected to a read word current supply section P6 through a wiring W9.

In a memory cell BA of the second row and the first column, a terminal T7 is connected to a read bit current supply section P1' through a wiring W12 and to a sense circuit P2' through a wiring W13. A terminal T1 is connected to a write bit current supply section P3' through a wiring W14. A terminal T3 is connected to a terminal T4 of the memory cell AA through a wiring W4. A terminal T5 is connected to a terminal T6 of the memory cell AA through a wiring W5. A terminal T9 is connected to a terminal T10 of the memory cell AA through a wiring W6. Terminals T4 and T6 are connected to the ground terminal.

In a memory cell AB of the first row and the second column, a terminal T7 is connected to a terminal T8 of the memory cell AA through a wiring W8. A terminal T1 is connected to a terminal T2 of the memory cell AA through a wiring W7. A terminal T3 is connected to a write word current supply section P5' through a wiring 22. A terminal T5 is connected to a Lorentz current supply section P4' through a wiring W21. A terminal T9 is connected to a read word current supply section P6' through a wiring 20. Terminals T8 and T2 are connected to the ground terminal.

In a memory cell BB of the second row and the second column, a terminal T7 is connected to a terminal T8 of the memory cell BA through a wiring W16. A terminal T1 is connected to a terminal T2 of the memory cell BA through a wiring W15. A terminal T3 is connected to a terminal T4 of the memory cell AB through a wiring W17. A terminal T5 is connected to a terminal T6 of the memory cell AB through a wiring W18. A terminal T9 is connected to a terminal T10 of the memory cell AB through a wiring W19. Terminals T4, T6, T10, T8 and T2 are connected to the ground terminal. In this manner, the memory cells AA, AB, BA and BB constitute a 4-bit memory cell matrix. The memory cell matrix having the arrangement described above satisfies all functions of the memory device.

Selective Write Access

FIG. 41A shows the write characteristics of the memory cell. Referring to FIG. 41A, the operating point of the selected memory cell in the "1" write operation is given as IW1F, and the operating point of a semiselected memory cell in the "1" write operation is given as IW1H. Relation IW1F=2IW1H is established. The operating point IW1H is set in an IW region for $\Delta ICS=0$, and the operating point IW1H is set in an IW region saturated with $\Delta ICS=\Delta ICS1$. Similarly, the operating point of the selected memory cell in the "0" write operation is given as IW0F, and the operating point of a semiselected memory cell in the "0" write operation is given as IW0H. Relation IW0F=2IW0H is established. The operating point IW0H is set in an IW region for $\Delta ICS=0$, and the operating point IW0H is set in an IW region saturated with $\Delta ICS=\Delta ISC0$. A selective write operation will be exemplified when the memory cell AA of FIG. 40 is selected, and the memory cells BA and AB are semi-selected. A write bit current corresponding to the IW1H is supplied to the superconductor layers 40 of the data write section of the respective memory cells from the write current supply section P3 through the wiring W3. A write word current corresponding to the IW1H is supplied to the superconductor layers 4 of the data write section of the respective cells from the write word current supply section P5 through the wiring W11. In the memory cell AA, since the write bit current and the write word current supplied to the data write section are superposed, the operating point of the write characteristics of FIG. 41A reaches IW1F, thereby writing the data in the superconductor film 1. However, in the memory cells BA and AB, since the write current IW1H is supplied to one of the superconductor layers 2 and 40 of the data write section, the operating points of the write characteristics of FIG. 41A reach IW1H, so that data is not written because $\Delta ICS=0$. In the memory cell BB, since a current is supplied neither to the superconductor layer 2 nor to the superconductor layer 40, no data is written.

The "0" data write operation is performed in the same manner as described above, except that IW1H, IW1F and $\Delta ICS1$ are respectively replaced with IW0H, IW0F and $\Delta ICS0$.

Selective Read Access

In the read threshold characteristics of the memory cell of FIGS. 38 and 39, a current IS supplied to the bias current lines 2 and 13 of the Josephson junction as the data readout section is set to be ISB in an overlap region between the "1" memory state threshold characteristic curve and the "0" memory state threshold characteristic curve. At the same time, a current ICS supplied to the read control line 6 of the Josephson junction as the data readout section is set to be ICSB plotted in the region below the "0" memory state threshold characteristic curve and above the region defined by the "0" memory state characteristic curve. Selective read access is exemplified when the memory cell AA in FIG. 40 is selected, and the memory cells BA and AB in FIG. 40 are semi-selected. The read bit current ISB is supplied to the bias current lines 2 and 13 of the Josephson junction as the data readout section of the respective memory cells from the read bit current supply section P1 through the wiring W1. Furthermore, the read word current ICSB is supplied to the control lines 6 of the Josephson junctions of the data readout section of the respective memory cells from the read word current supply section P6 through the wiring W9. In the memory cell AA, since the read bit current and the read word current are supplied to the Josephson junction of the data readout section, the operating point of the read threshold characteristics in FIG. 41B reaches point Q. When the memory state of the memory cell AA is set at "1", the operating point Q crosses the threshold curve and exceeds the "1" curve, and thus the Josephson junction changes from the zero-voltage state to the voltage state. This voltage is detected by the sense circuit P2 to detect that the memory cell AA is set in the "1" memory state. However, when the memory cell AA is set in the "0" memory state, the operating point Q is below the "0" threshold characteristics, and the Josephson junction is kept in the zero-voltage state. In this case, the sense circuit P2 does not detect the voltage and detects that the memory cell AA is held in the "0" memory state. In the memory cells BA and AB, only the read bit current ISB from the read word current supply section P6 or the read bit current supply section P1 is supplied to the bias current lines 2 and 13 of the Josephson junction, or only the read word current ICSB is supplied to the control lines 6 of the Josephson junction. Thus, the operating points are the "1" and "0" threshold characteristic curves. The zero-voltage state of the Josephson junction is not changed to the voltage state irrespective of the "1" or "0" memory state. Therefore, the Josephson junctions of the semi-selected memory cells are held in the zero-voltage state irrespective of the "1" or "0" memory state, thereby performing normal operation of the memory cell matrix. The memory cell BB receives neither the read word current nor the read bit current, so that the Josephson element 3 of the data readout section thereof is held in the zero-voltage state. The Josephson element of the nonselected memory cell is held in the zero-voltage state irrespective of the "1" or "0" memory state, thereby performing the normal operation of the memory cell matrix.

Selective read/write access of the memory cell AA in the memory cell matrix of two rows×two columns has been exemplified. When the memory cell BA is selected, the current supply sections P1 and P3 are replaced with the current supply sections P1' and P3'. At the same time, the sense circuit P2 is replaced with the sense circuit P2'. When the memory cell AB is selected, the current supply sections P4, P5 and P6 are replaced with the current supply sections P4', P5' and P6'. When the memory cell BB is selected, current supply sections P1, P3, P4, P5 and P6 are replaced with P1', P3', P4', P5' and P6', respectively. At the same time, the sense circuit P2 is replaced with the sense circuit P2'.

The Lorentz current is supplied to the Lorentz current lines 4a and 4b of each memory cell from the Lorentz current supply section P4 or P4' in the data read/write operation. Since the vortex generated by the Lorentz current can be transported at high speed, high-speed write operation can be performed. Furthermore, the vortex profile can be modified and a large number of vortices can be stored near the data readout section, detection sensitivity for the vortex can be improved, and a wide operation margin is guaranteed. The bias current for the Josephson junction of the data readout section and the Lorentz current flowed through the superconductor film as the data storage section can be independently supplied.

The present invention is not limited to the particular embodiments described above. Various changes and modifications may be made within the spirit and scope of the invention. For example, the data detecting section comprises the Josephson element with one Josephson junction. However, as shown in FIG. 42, a SQUID (superconducting vortex interference device) with a pair of Josephson junctions JJA and JJB can be used to constitute a Josephson element. Referring to FIG. 42, reference numeral 100 denotes a Josephson junction; and 101 and 102, electrodes of a superconductor which are arranged to sandwich the Josephson junction 100. The broken line represents a magnetic flux.

The above-mentioned embodiments can be combined, or one or more elements of each embodiment can be replaced with constituting elements of another embodiment. For example, the insulating layer 14 can be omitted, and a structure which does not allow injection of the vortex can be adapted instead, as shown in FIGS. 6 and 7. The Lorentz current supply bias current lines 1a and 1b are shown in FIGS. 10 and 11, but can be omitted.

What is claimed is:

1. A superconducting memory device comprising:
   vortex storage means constituted by a thin type-II superconductor film and for storing an Abrikosov vortex;
   write control means for generating the vortex in said vortex storage means; and
   vortex detecting means for detecting a polarity of the vortex stored in said vortex storage means,
   said vortex detecting means including a Josephson junction and a read control current line,
   said Josephson junction comprising a base electrode, a counter electrode and a tunnel barrier region sandwiched between said base electrode and said counter electrode,
   wherein by utilizing a fact that a shift direction of the threshold characteristics of said vortex detecting means corresponds to the polarity of said vortex stored in said vortex storage means, a flux crossing said tunnel barrier region of said Josephson junction due to said stored vortex is detected by said read control line.

2. A device according to claim 1, which further includes means does not allow injection of said Abribosov vortex into a position of said base electrode corresponding to said tunnel barrier region of said Josephson junction.

3. A device according to claim 1, wherein said base electrode is constituted by said vortex storage means.

4. A device according to claim 1, wherein said write control means performs a write operation at a write control current given such that a shift along a read control current axis of the threshold characteristics of said vortex detecting means reaches a saturation region, while the Abrikosov vortex is stored in said vortex storage means.

5. A device according to claim 1, wherein said base electrode of said Josephson junction comprises a substantially U-shaped superconductor layer formed on said thin type-II superconductor film of said vortex storage means, a portion of said thin type-II superconductor film which is not covered by said U-shaped superconductor layer being adapted as a portion through which the vortex enters based on a magnetic field generated by said write control means.

6. A device according to claim 1, wherein said base electrode of said Josephson junction has a thickness larger than that of said thin type-II superconductor film of said vortex storage means.

7. A device according to claim 1, wherein said base electrode of said Josephson junction consists of a material different from that of said thin type-II superconductor film of said vortex storage means.

8. A device according to claim 1, wherein said base electrode of said Josephson junction is formed on said thin type-II superconductor film of said vortex storage means through an insulating layer.

9. A device according to claim 1, wherein said counter electrode of said Josephson junction is formed above said thin type-II superconductor film of said vortex storage means, said counter electrode extending beyond an end of said base electrode.

10. A device according to claim 1, wherein said counter electrode of said Josephson junction extends outward from a side of said thin type-II superconductor film of said vortex storage means, said counter electrode extending beyond an end of said base electrode, and wherein a superconductive layer as a ground plane is extended under said thin type-II superconductor film of said vortex storage means to a position opposite to an extended portion of said base electrode.

11. A device according to claim 1, wherein said write control means is connected to a current supply line for supplying a write current to opposite ends spaced apart from a position where said Josephson junction is formed on said thin type-II superconductor film of said vortex storage means.

12. A device according to claim 1, wherein said write control means comprises a write control line arranged through an insulating layer below said thin type-II superconductor film of said vortex storage means and on the opposite side to said vortex detecting means.

13. A device according to claim 1, wherein said Josephson junction formed on said thin type-II superconductor film of said vortex storage means is located at a position where a magnetic field generated by said write control means is comparatively small.

14. A device according to claim 1, further comprising a weak superconductive or normal conductive region formed in said thin type-II superconductor film as said vortex storage means adjacent to said vortex detecting means.

15. A device according to claim 14, wherein said weak superconductive or normal conductive region formed in said thin type-II superconductor film has a potion extending to a position near said write control means.

16. A device according to claim 1, wherein said vortex storage means has storage areas formed at two sides of said vortex detecting means.

17. A device according to claim 16, wherein said write control means has a write control line formed for each of said storage areas.

18. A device according to claim 1, wherein said write control means comprises a write control line connected to said thin type-II superconductor film of said vortex storage means along a control line direction.

19. A device according to claim 18, wherein part of said thin type-II superconductor film of said vortex storage means near said Josephson junction is narrowed.

20. A device according to claim 1, further comprising a superconductor write control line near said vortex storage means to constitute write control means.

21. A device according to claim 20, wherein said vortex storage means has sides which are substantially perpendicular to one another and wherein said write control means is formed near and parallel to one side of said vortex storage means.

22. A device according to claim 21, wherein said write control means comprises at least two parallel superconductor write control lines, and a signal corresponding to the "1" or "0" storage state is generated in said vortex detecting means only when write currents flow in said at least two control lines.

23. A device according to claim 21, wherein said vortex storage means comprises a square or rectangular superconductor film, and said write control means comprises superconductor write control lines which extend along a read control line direction and which are connected to opposed sides of said superconductor film so that a write control current flowing on said write control lines causes said vortex storage means to generate the Abrikosov vortex.

24. A device according to claim 21, wherein a superconductor layer is formed to extend to a portion excluding a central portion of a side of said thin type-II superconductor film of said vortex storage means, said side being adjacent to said write control means, and said last superconductor layer being constituted by a material of a large lower critical magnetic field.

25. A device according to claim 21, wherein sides of said thin type-II superconductor film of said vortex storage means, except for a portion of one side thereof which is adjacent to said write control means, are covered with a superconductor layer with characteristics which do not substantially allow generation of the vortex.

26. A device according to claim 25, wherein said superconductor layer with the characteristics which do not substantially allow generation of the vortex has a thickness larger than that of said thin type-II superconductor film of said vortex storage means.

27. A superconducting memory device with a large number of memory cells in a matrix form, each memory cell comprising:
  vortex storage means constituted by a thin type-II superconductor film and for storing an Abrikosov vortex;
  write control means for generating the vortex in said vortex storage means; and
  vortex detecting means for detecting a polarity of the vortex stored in said vortex storage means,
  said vortex detecting means including a Josephson junction and a read control current line,
  said Josephson junction comprising a base electrode, a counter electrode and a tunnel barrier region sandwiched between said base electrode and said counter electrode,
  wherein by utilizing a fact that a shift direction of the threshold characteristics of said vortex detecting means corresponds to the polarity of said vortex stored in said vortex storage means, a flux crossing said tunnel barrier region of said Josephson junction is detected by said read control line.

28. A device according to claim 27, wherein said write control means at least two parallel superconductor control lines, and a signal corresponding to the "1" or "0" storage state is generated by said write control means only when write current flow in said at least two control lines.

29. A device according to claim 28, further comprising a current supply line connected to a portion of said thin type-II superconductor film of said vortex storage means near said at least two control lines, said current supply line being adapted to cause a Lorentz current to flow in a direction parallel to said at least two control lines.

* * * * *